(12) United States Patent
Schoeberl et al.

(10) Patent No.: US 8,868,382 B2
(45) Date of Patent: Oct. 21, 2014

(54) METHOD, DEVICE AND COMPUTER PROGRAM PRODUCT FOR DETERMINING AN ELECTROMAGNETIC NEAR-FIELD OF A FIELD EXCITATION SOURCE OF AN ELECTRICAL SYSTEM

(75) Inventors: Joachim Schoeberl, Herzogenrath (DE); Christoph Koutschan, Grub am Forst (DE); Peter Paule, Altenberg bei Linz (AT)

(73) Assignee: CST-Computer Simulation Technology AG, Darmstadt (DE)

( * ) Notice: Subject to any disclaimer, the term of this patent is extended or adjusted under 35 U.S.C. 154(b) by 439 days.

(21) Appl. No.: 13/084,842

(22) Filed: Apr. 12, 2011

(65) Prior Publication Data

US 2011/0251832 A1 Oct. 13, 2011

(30) Foreign Application Priority Data

Apr. 13, 2010 (EP) .................................. 10159805

(51) Int. Cl.
*G06F 17/11* (2006.01)
*G06F 17/50* (2006.01)

(52) U.S. Cl.
CPC .................................. *G06F 17/5018* (2013.01)
USPC ............................................................ 703/2

(58) Field of Classification Search
None
See application file for complete search history.

(56) References Cited

PUBLICATIONS

Authors Unknown, "OneDimensional Finite Element Methods", Chapter 2 of teaching material of Joseph E. Flaherty, http://www.cs.rpi.edu/~flaherje/pdf/fea2.pdf as obtained from web.archive.org for Nov. 27, 2006.*
Loula Fezoui et al, Convergence and Stability of a Discontinuous Galerkin Time-Domain Method for the 3D Heterogeneous Maxwell Equations on Unstructured Meshes, ESAIM: M2AN, vol. 39, No. 6, 2005, pp. 1149-1176 DOI: 10.1051/m2an:2005049.*
Authors Unknown, "Hyperbolic Problems", Chapter 10 of teaching material of Joseph E. Flaherty, http://www.cs.rpi.edu/~flaherje/pdf/fea10.pdf as obtained from web.archive.org for Nov. 27, 2006.*
European Official Action (Apr. 19, 2011) for corresppnding European App. 10159805.0.
Christoph Koutschan: "Advanced Applications of the Holonomic Systems Approach", Johannes Kepler University of Linz Dissertation, Sep. 2009, found on the Internet: URL:http://www.risc.jku.at/publications/download/risc_3886/thesisKoutschan.pdf.

(Continued)

*Primary Examiner* — Omar Fernandez Rivas
*Assistant Examiner* — Robert Brock
(74) *Attorney, Agent, or Firm* — WRB-IP LLP

(57) ABSTRACT

The present invention relates to a method, a device and a computer program product for determining an electromagnetic near-field of a field excitation source of an electrical system. The method includes defining electrical and magnetic properties of the system, defining a field excitation source, determining electromagnetic near-field components by solving Maxwell's equations of the near-field, where each near-field component of each partition is represented by a linear position of M orthogonal ansatz functions weighted with field coefficients, whereby spatial and/or time derivatives of the near-field component are determined as a linear position of these ansatz functions weighted with derivative coefficients, which can be determined from the field coefficients and the derivative coefficients, so that the determination effort rises linearly with the complexity of the electrical system.

12 Claims, 11 Drawing Sheets

(56) References Cited

PUBLICATIONS

Figure 1:
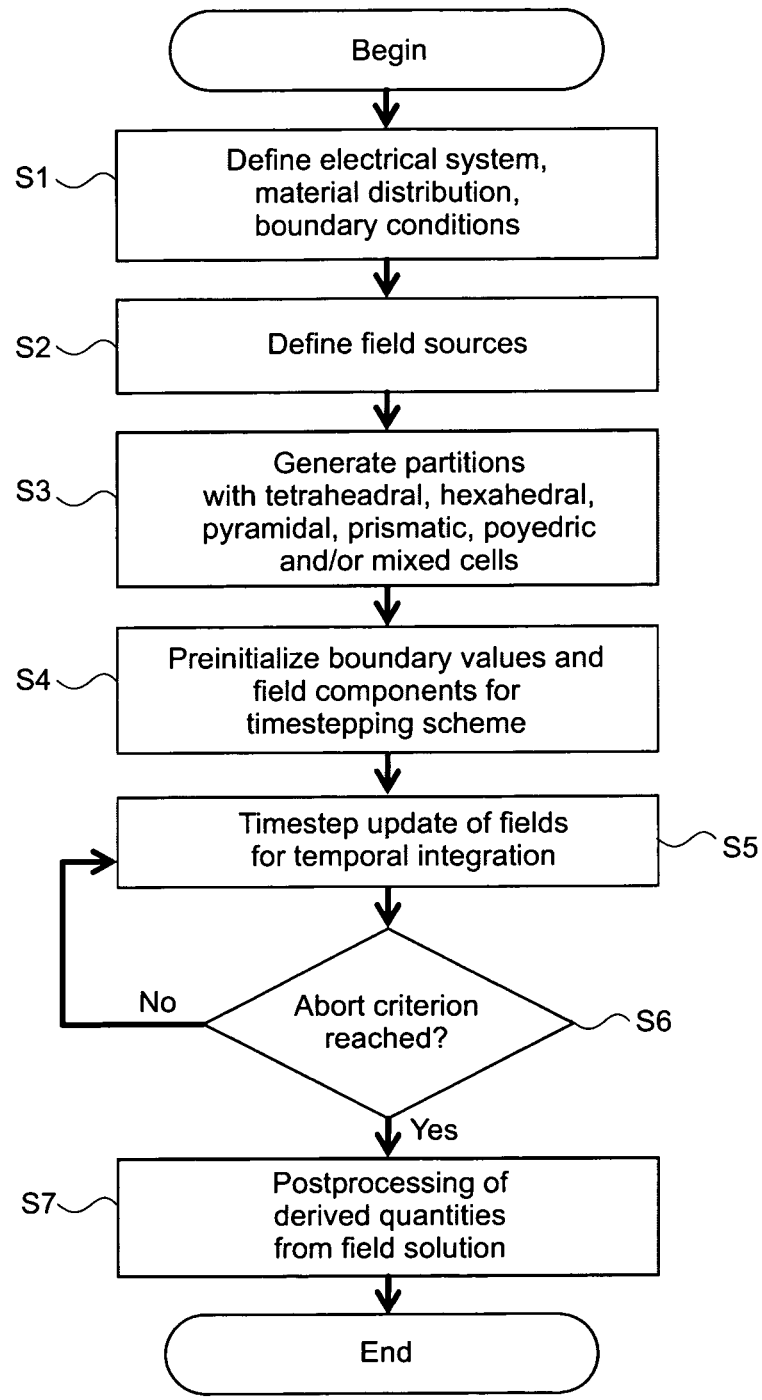

Database Inspec [Online] The Institution of Electrical Engineers, Stevenage, GB; Sep. 1, 2002, Hesthaven J S et al: "Nodal high-order methods on unstructured grids, I. Time-domain solution of Maxwell's equations", Database accession No. 7435812; & Journal of Computational Physics Academic Press USA, vol. 181, No. 1, pp. 186-221, ISSN: 0021-9991, DOI: DOI:10.1006/JCPH.2002.7118.

Keerti S. Kona et. al: "Implementation of a Discontinuous Galerkin (DG) Method for Antenna Applications", Antennas and Propagation International Symposium, 2007 IEEE, IEEE, Piscataway, NJ, USA, on Jun. 1, 2007, pp. 4995-4998, ISBN: 978-1-4244-0877-1.

Stephen D. Gedney et al: "The Discontinuous Galerkin Finite Element Time Domain Method (DGFETD): A High Order, Globally-Explicit Method for Parallel Computation", 2002 IEEE International Symposium on Electromagnetic Compatibility, EMC, Symposium Record, Minneapolis, MN, Aug. 19-23, 2002: pp. 1-3, ISBN: 978-0-7803-7264-1.

Goedel N. et al "Local timestepping discontinuous Galerkin methods for electromagnetic Galerkin methods for electromagnetic RF field problems", Antennas and Propagation, 2009, EUCAP 2009, 3rd European Conference on, IEEE, Piscataway, NJ, USA, Mar. 23, 2009, pp. 2149-2153, ISBN: 978-1-4244-4753-4.

Goedel N. et al "Time domain discontinuous Galerkin method with efficient modelling of boundary conditions for simulations of electromagnetic wave propagation", Electromagnetic Compatibility and 19th International Zurich Symposium on Electromagnetic Compatibility, 2008, APEMC 2008, Asia-Pacific Symposium on, IEEE, Piscataway, NJ, USA, May 19, 2008, pp. 594-597, ISBN 978-981-08-0629-3.

Harald Songoro et al: "Keeping Time with Maxwell's Equations", IEEE Microwave Magazine, IEEE Service Center, Piscataway, NJ, USA, Apr. 1, 2010, pp. 42-49, ISSN: 1527-3342.

Irina Munteanu et al: "It's About Time" IEEE Microwave Magazine, IEEEService Center, Piscataway, NJ, US LNKD-DOI: 10.1109/MMM.2010.935775, Bd. 11, No. 2, Apr. 1, 2010, pp. 60-69, XP011290483 ISSN: 1527-3342.

European Search Report for corresppnding European App. 10159605.0.

\* cited by examiner

52

56

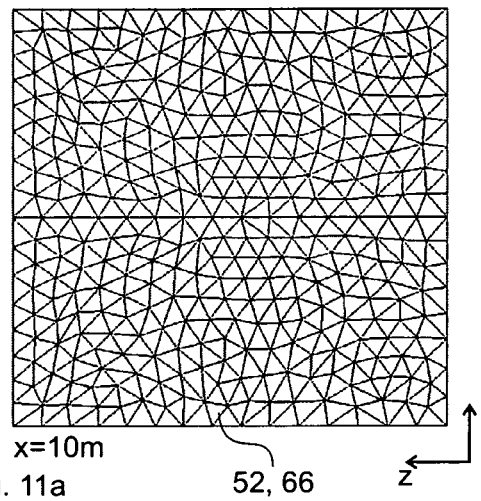
x=10m
Fig. 11a   52, 66
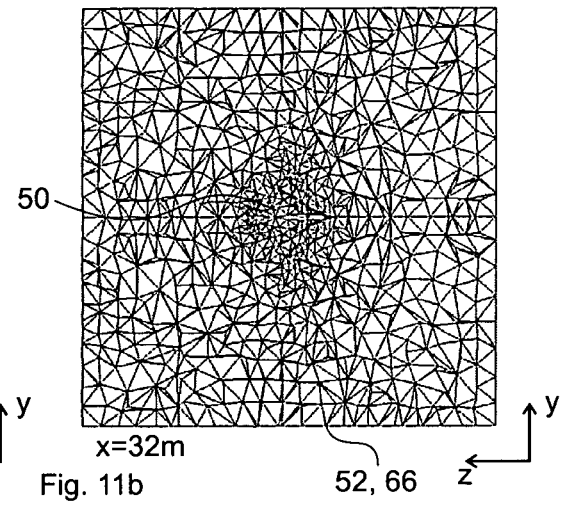
x=32m
Fig. 11b   52, 66
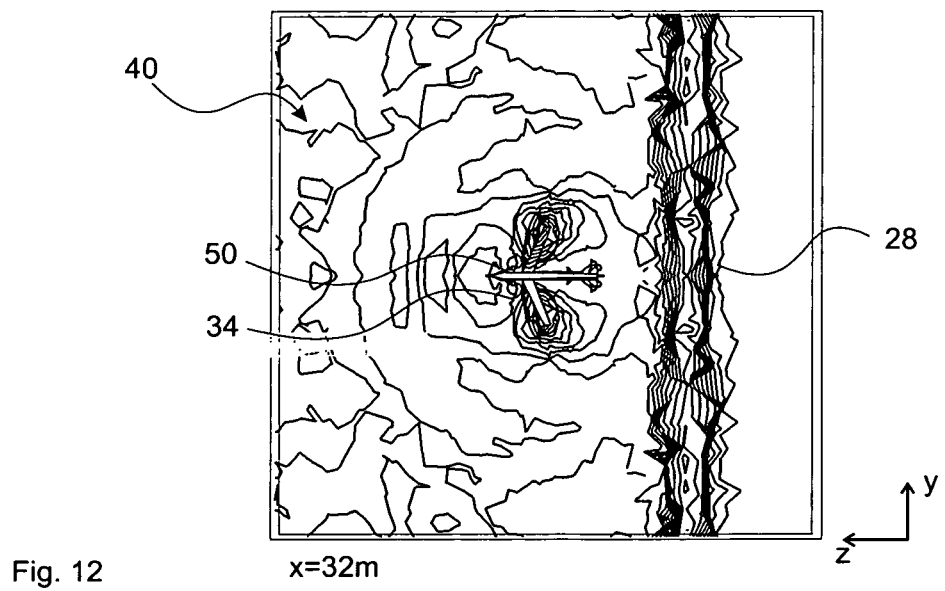
Fig. 12   x=32m

METHOD, DEVICE AND COMPUTER PROGRAM PRODUCT FOR DETERMINING AN ELECTROMAGNETIC NEAR-FIELD OF A FIELD EXCITATION SOURCE OF AN ELECTRICAL SYSTEM

PRIOR ART

The present invention relates to a method, a device and a computer program product for determining an electromagnetic near-field of a field excitation source of an electrical system, in particular for analysis and/or optimization of an antenna radiation, of a cross-talk problem, of a signal reflexion/transmission, of a stray field, of an irradiation problem or the like.

In this connection, the electromagnetic system is considered within a domain under consideration split into N partitions.

Methods are known from the prior art for determining an electromagnetic near-field of a field excitation source of an electrical system without application, in particular for optimization of a component development of electromagnetic systems or for optimization of essential electromagnetic properties such as radiation behaviour, beam direction optimization, suppression of cross-talk, optimization of a transmission or reflexion of electromagnetic waves, minimization of a stray field or the like. For determining the fields, on the one hand practical test arrays and measuring devices are known which can by means of electromagnetic sensors, for example antennas, Hall sensors, field strength sensors or similar, measure electromagnetic fields, in particular in the high-frequency domain, but also in the low-frequency domain, where for example during determination of an antenna radiation characteristic a measuring probe is passed mechanically around a considered component and at certain intervals measurements of the radiated RF power are taken.

For measurement-based optimization of an electromagnetic component or system, however, a series of test arrays with altered specifications must be built and measured. With increasing computer power and corresponding developments in the field of theoretical/numerical field theory, it has been possible in recent years to conduct comparable analyses and optimizations of electromagnetic systems within a model domain. To do so, an electromagnetic system, for example an antenna of a mobile radio telephone, an outer hull of an aircraft, a waveguide structure or signal-carrying line connections of a PCB (printed circuit board) or similar electromagnetic systems are recreated in a numerical model, and the Maxwell's equations applicable thereto are solved by means of optimization processes.

Compared with measurement-based analysis and optimization processes, such computer-assisted methods offer the advantage of fast analysis of a large number of components, where individual component parameters such as material properties, mechanical dimensions, excitation frequencies or similar are varied within the framework of an optimization calculation and hence a large number of different electromagnetic systems can be tested in respect of one or more optimization strategies. Computer-assisted field determinations are generally divided into frequency domain determinations and time domain determinations. Frequency domain determinations consider an electromagnetic system at one or more fixed frequencies, where a harmonic approach can be selected for determining the electromagnetic fields. Time domain considerations determine the time curve of an excitation signal and can analyse a large number of frequency components of a time signal as well as the behaviour of pulses, for example during cross-talk of adjacent electrical lines on a PCB.

Numerical calculation methods applied to structured partitions, designated as grid cells, are known from the prior art, with hexahedral grids or tetrahedral grids being mentioned as typical, where the main representatives of such electromagnetic determination methods are the Finite Difference (FD), the Finite Integration (FIT) and the Finite Element (FEM) methods.

The computational effort of the various methods plays a crucial role in the use of these methods. Computational effort and determination effort indicate in the following, unless described to the contrary, the memory requirement for determination of the near-field solution and the time-related computational effort per calculation of a spatial and/or time derivative, which for example must be calculated in a timestepping method or an iterative method.

The Finite Difference and the Finite Integration methods can be applied preferably to hexahedral grids and have a substantially linear complexity, i.e. an increase in the number of grid cells or enlargement of the electromagnetic system in one direction leads to a linear rise of the computational effort with regard to a number N of considered partitions (grid cells). Approaches based on the Finite Element method are in many cases applied to so-called unstructured tetrahedral cells, where the determination effort grows in superlinear manner, often quadratically or higher, with the number of unknowns considered. To increase the accuracy of a determination solution, the size of the partitions used, in particular the spatial dimensions of a grid cell, can be reduced, this being referred to as the so-called h-refinement. In addition, the approximation accuracy of the ansatz functions used can be increased, this being referred to as the p-refinement, where the term p describes the maximum degree of the ansatz polynomials when the latter are used as ansatz functions. The Finite Integration method was first presented by T. Weiland in the article "Eine Methode zur Lösung der Maxwellschen-Gleichungen für sechskomponentige Felder auf Diskreter Basis", in. Electronics and Communication (AEÜ), Volume 31(3), March 1977, pages 116 to 120. The method of Finite Differences in the time domain was initially presented by Kane Yee in the article "Numerical Solution of Initial Boundary Value Problems Involving Maxwell's Equations in Isotropic Media", in Antennas and Propagation, IEEE Transactions, Volume 14, pages 302 to 307, in 1966. The method of Finite Elements and specifically mixed or edge elements as described by J. C. Nédélec in the article "Mixed Finite Elements in R^3", in Numerische Mathematik, Volume 35, pages 315-341 in 1980 permits, unlike the previously mentioned methods, which only determine field values at support points on the grid field, an approximated solution in the entire area under consideration for the Maxwell's equations, mostly on the basis of a Galerkin formulation. However, at present only methods are known which require a complex inversion of a global equation system and have—in particular in the case of an increase of the polynomial degree p—a superlinear determination complexity. These methods are thus unsuitable for electromagnetically large domains under consideration.

Structured grids, for example hexahedral grids are distinguished by a clear and previously known proximity relationship of the grid cells. In contrast to this, proximity relationships of unstructured grid cells must be filed and noted separately. The drawback of a discretization of electromagnetic systems by means of structured cells is the lack of flexibility in grid generation, where in particular curved surfaces of components or structures can only be imaged with great difficulty using structured grids. Unstructured grids permit a substantially better imaging of curved surfaces of electromagnetic systems, however the greater computational effort required for the same size of domain under consideration sets natural limits on the complexity of an electromagnetic system.

The publication by Keerti S. Kona et. al: "Implementation of a Discontinuous Galerkin (DG) Method for Antenna Applications", Antennas and Propagation International Symposium, 2007 IEEE, IEEE, Piscataway, N.J., USA, on 1 Jun. 2007, pages 4995-4998, ISBN: 978-1-4244-0877-1, describes the integral variant of Maxwell's equations for solution of an electromagnetic field problem, where test functions of the Galerkin approach serve as basic functions for representing the fields. The basic functions in the implementation used are defined as $v_L^i(x)=[x-x_i]^a \times [y-y_i]^b \times [z-z_i]^c)$ for $0 < a+b+c \leq N$, in which N represents the order of the polynomial. An application of the method leads not to a linear, but to an at least quadratic numerical complexity in the case of an increase of the polynomial degree.

Stephen D. Gedney et al: "The Discontinuous Galerkin Finite Element Time Domain Method (DGFETD): A High Order, Globally-Explicit Method for Parallel Computation", 2002 IEEE International Symposium on Electromagnetic Compatibility, EMC, Symposium Record, Minneapolis, Minn., Aug. 19-23, 2002; pages 1-3, ISBN: 978-0-7803-7264-1 likewise shows standard FEM ansatz functions. A representation of the complexity of an h or p refinement is lacking, so that any indication of a substantially linear complexity cannot be found.

Goedel N. et al "Local timestepping discontinuous Galerkin methods for electromagnetic Galerkin methods for electromagnetic RF field problems", Antennas and Propagation, 2009, EUCAP 2009, 3rd European Conference on, IEEE, Piscataway, N.J., USA, 23 Mar. 2009, pages 2149-2153, ISBN: 978-1-4244-4753-4, describes a similar kind of discontinuous Galerkin method in which a local timestepping method on basis of an explicit Runge-Kutta method is used. The main focus of the method is based on a modified time-related integration rule, though the publication is silent on the type of spatial ansatz functions for determining the fields.

In addition, Goedel N. et al "Time domain discontinuous Galerkin method with efficient modelling of boundary conditions for simulations of electromagnetic wave propagation", Electromagnetic Compatibility and 19th International Zurich Symposium on Electromagnetic Compatibility, 2008, APEMC 2008, Asia-Pacific Symposium on, IEEE, Piscataway, N.J., USA, 19 May 2008, pages 594-597, ISBN 978-981-08-0629-3, relates to a similar kind of determination process where no statements are made relating to the numerical complexity.

Finally, Harald Songoro et al: "Keeping Time with Maxwell's Equations", IEEE Microwave Magazine, IEEE Service Center, Piscataway, N.J., USA, 1 Apr. 2010, pages 42-49, ISSN: 1527-3342, describes a further variant of a discontinuous Galerkin approach, where standard FEM ansatz and test functions are applied in a partition.

The above publications disclose known discontinuous Galerkin functions known from this approach similar to that of Jan S. Hesthaven and Tim Warburton. These known approaches are based on functions and methods having a superlinear complexity in the number of ansatz functions, in particular in a complexity of at least $O(x^{2d})$ for x=polynomial degree p or number of partitions N, and d-dimensions for calculation of the spatial and/or time derivative.

The prior art thus results in the problem of providing a determination method for analysis and optimization of an electrical system, in particular in respect of an antenna radiation, of a cross-talk problem, of a signal reflexion or transmission, of determination of a stray field (RCS—Radar Cross Section calculation), of an antenna radiation or similar, using which method the Maxwell's equations can be solved on an unstructured, in particular tetrahedral, pyramidal, prismatic or mixed grid, whereby the computational effort grows linearly with the number of unknowns to be determined in the domain under consideration, i.e. linearly with regard to the number of partitions N (h-refinement) and linearly with the number M of ansatz functions used, in particular affected by the approximation quality of the ansatz functions (p-refinement).

This problem is solved by a method, a device and a computer program product in accordance with the independent claims. Advantageous further developments are the subject-matter of subclaims.

DISCLOSURE OF THE INVENTION

In accordance with a first aspect of the present invention, a method is presented for determining an electromagnetic near-field of a field excitation source of an electrical system, in particular for analysis and optimization of an antenna radiation, of a cross-talk problem, of a signal reflexion/transmission, of a stray field, of an irradiation problem or the like, which within a domain under consideration containing the system and divided up into N partitions performs the following steps:

definition of electrical and magnetic properties of the material distribution of the system in each partition (grid cell) within the domain under consideration;

definition of at least one field excitation source within the system;

determination of the electromagnetic near-field component within at least one and in particular all partitions, by solution of the Maxwell's equations of the near-field, taking into account the defined material distribution and the defined field excitation source.

Each near-field component of each partition is represented here by a linear position of M predetermined ansatz functions $P_i$ orthogonal to one another with regard to the L2 scalar product and weighted with field coefficients $v_i$, and the spatial and/or time derivative of the near-field component required for solution of the Maxwell's equations can be determined as a linear position of these ansatz functions $P_i$ weighted with derivative coefficients $w_i$. When ascertaining the electrical near-field, each coefficient $w_i$ is determined from a quantity of previously determined field coefficients $v_i$ and derivative coefficients $w_i$, so that the determination effort of the near-field of the system rises in substantially linear manner to the number N of partitions in the domain under consideration and to the number M of ansatz functions $P_i$ (42) used in the linear position.

In other words, the method relates to a preferably computer-assisted procedural method for determination of an electromagnetic near-field, for example of an antenna radiation, of a plane wave irradiation inside an electromagnetic system, of a cross-talk behaviour between adjacent lines of a PCB, of a signal reflexion onto waveguides, for example during transition from one waveguide form to another or when changing the waveguide material. Using this method, mechanical and also electrical properties of the electrical system can be altered quickly and easily, with the system being "discretized" in a domain under consideration. To do so, in the domain under consideration N partitions are introduced which for example comprise hexahedral, pyramidal, tetrahedral or prismatic grid cells or similar, including mixed ones. In these partitions (grid cells), electrical and magnetic properties of the material distribution of the system are defined, in particular permeability μ, permittivity ε and conductivity κ. Furthermore, a field excitation source is defined, for example dipole radiation, incidence of a plane wave, mode excitation at an electromagnetic port or similar, and the Maxwell's equations are solved for all electromagnetic field components inside all partitions. For determination of the near-field components, a description of each near-field component, in particular electrical field strength E, dielectric flux density D, magnetic field strength H, magnetic flux density B, current flux density J, is selected and can be represented as the linear position of M predetermined ansatz functions $P_i$ weighted with field coefficients $v_i$ and orthogonal to one another with regard to the L2 scalar product. The Maxwell's equations require in addition to the field representation also its time and/or spatial variation, in particular first derivatives $$\frac{d}{dt},$$

curl $\vec{X} = \nabla \times \vec{X}$ where $$\nabla = \begin{pmatrix} \frac{d}{dx} \\ \frac{d}{dy} \\ \frac{d}{dz} \end{pmatrix},$$

which can also be shown as a linear position of these ansatz functions $P_i$ weighted with other derivative coefficients $w_i$. It is possible here to determine the derivative coefficients $w_i$ from a quantity of previously determined field coefficients $v_i$ and derivative coefficients $w_i$ such that in the event of an expansion of the domain under consideration (number N of partitions) or increase in the degree of approximation of the linear position M of ansatz functions $P_i$ the determination effort grows in substantially linear manner with the number of partitions and the number of ansatz functions. It is thus possible to achieve a memory-optimized and fast application of operators, in particular of the gradient/rotation (curl)/divergence operators operating in the volumes of the partitions and of corresponding trace operators operating on the boundaries of the partitions and serving to couple the field fluxes of adjacent partitions, or their transposes, and of the mass operators and their inverses (material property operators for converting field strengths to flux densities/current densities and vice versa). If such a basis of ansatz functions and a formulation of the gradients as recursive determination from the ansatz functions is known, the latter can be implemented in any grid types to perform a determination of the electromagnetic near-field of an electrical system, where the determination requirement rises in substantially linear manner with the partition number N and the number M of ansatz functions used, so that an increase in the number of grid cells N (h-refinement) or an increase in the number M of ansatz functions $P_i$ used (p-refinement) only leads to a substantially linear extension of the computation time or computational effort. As a rule, for certain grid types, in particular hexahedral, pyramidal, prismatic, tetrahedral or mixed grids, specifically suitable ansatz functions are selected.

The expression "substantially linear" relates to the determination effort of the spatial and/or time derivative, which rises in substantially linear manner to the number N of partitions of the domain under consideration and to the number M of ansatz functions used in the linear combination. Thus the term "substantially linear" is regarded as a linear determination effort for the mainly relevant parts of the method, so that an increase in the number of grid cells N or an increase in the number M of used ansatz functions P only leads to a substantially linear extension of the computation time or computational effort. With known methods such as known Finite Element methods of the prior art, an increase in the polynomial degree p or an increase in the number of partitions N regularly leads to a superlinear, often quadratic or higher determination effort with the number of considered unknowns. It is thus clear that a substantially linear effort represents an effort that for the main components of the invention has a computational complexity $O(p^d)$ or $O(N^d)$, where d is the number of spatial dimensions.

The expression "with regard to a scalar product" means the property of the ansatz function P that the latter is orthogonal with regard to a scalar product defined as a function of the specific ansatz functions. A scalar product of this type represents a functional relationship which links two elements of a vector space. In that sense, two functions unequal to the zero function are designated as orthogonal if this scalar product of the two functions is equal to zero, see in this connection Bronstein, Semendjajew, Musiol, Mühlig: "Taschenbuch der Mathematik", 4th edition, p. 613ff, Verlag Harri Deutsch, Frankfurt am Main, 1999. Hence the orthogonality of two functions depends on the selected scalar product.

In accordance with an advantageous embodiment, the domain under consideration is partitioned, i.e. split up into individual grid cells, by an unstructured grid, in particular by a tetrahedral, pyramidal, prismatic grid or by a mixed form of these grid cells, which can for example also comprise hexahedral cells. Unlike a structured grid, an unstructured grid cannot be considered without knowledge of proximity relationships with adjacent grid cells. Structured grids, in particular hexahedral grids or grids in spherical or cylindrical coordinates, permit simple addressing of a grid cell by means of three indices in the three-dimensional case. Unstructured grids, in particular tetrahedral grids, can only be addressed with a greater effort in consideration of a proximity relationship between individual grid nodes, grid surfaces and grid edge. On the other hand, unstructured grids permit a better approximation of geometrical surfaces.

In accordance with a further advantageous design, each electromagnetic near-field component is ascertained by means of DG-FEM (Discontinuous Galerkin Finite Element Method). The application of the DG-FEM method for Maxwell's equations for calculating electromagnetic near-field components is for example known from Jan S. Hesthaven and Tim Warburton "Nodal Discontinuous Galerkin Methods", Algorithms, Analysis, and Applications, Springer Science+Business Media, LLC, New York, 2008. However this description does not show the application of orthogonal ansatz functions, whose spatial or time derivative can be recursively determined from a quantity of previously determined field and derivative coefficients with linear complexity, and in particular not for mixed grids with hexahedral, pyramidal, tetrahedral and prismatic grid cells. The approach there is based on ansatz functions and methods having a superlinear complexity in the number of ansatz functions, in particular a complexity $O(p^{2d})$ for d-dimensions and a maximum polynomial degree of p of the spatial and/or time derivatives of the determination method. A p-refinement, i.e. an increase in the number M of superpositioned ansatz functions $P_i$, thus leads to a superlinear rise in the computational effort.

In accordance with an advantageous embodiment of the method, each coefficient $w_i$ is recursively ascertained from a previously determined quantity of coefficients $v_j$, $w_j$. As a result, coefficients $w_i$ can be linearly recursively calculated from a set of previously determined components $v_j$, $w_j$, in particular in time domain methods in which one timestep after the other is calculated, from already predetermined coefficients. A linearly recursive calculation means that coefficients currently under consideration are determined in a linear link and substantially with the aid of coefficients of the previous time step or of a preceding iteration/approximation solution. It is thus possible for coefficients of a subsequent time step/iteration to be determined with linear complexity from previously calculated coefficients. In particular, for a 1D field representation of given near-field components $v(x)$, which can be expressed as the sum of the spatial field ansatz functions $$v(x) = \sum_{i=0}^{M-1} v_i P_i(x),$$

their spatial derivatives can be calculated as $$\text{grad}[v(x)] = \sum_{i=0}^{M-1} v_i \text{grad}[P_i(x)] = \sum_{i=0}^{M-1} w_i P_i(x),$$

where the spatial derivative coefficients $w_i$ can be calculated recursively with $w_i = f(v_j, w_j)$.

In accordance with a further advantageous embodiment, the ansatz functions $P_i$ are selected as orthogonal polynomials, where a linear position of a field component can advantageously be written as $$v(x) = \sum_{i=0}^{M-1} v_i P_i(x),$$

with M ansatz polynomials, where the degree p of each ansatz polynomial $P_i$ is precisely i. As a result, every ansatz function is described as an overall polynomial of the degree p=M-1, where an increase in M corresponds to an increase of the polynomial degree, and hence effects a p-refinement. Such orthogonal polynomials can be designed as required, and are preferably represented as Legendre polynomials or as more general Jacobi polynomials. Polynomials are orthogonal if they fulfil over an interval [a,b] with an additional weight function $\rho(x)$ the orthogonality condition formula $\int_a^b \rho(x) P_n(x) P_m(x) dx = 0$ for all $m,n \in N_0$ with $m \neq n$. Legendre and Jacobi polynomials in particular can be determined recursively in accordance with a simple formula and quickly derived for any polynomial degrees.

Based on the above embodiments, for a 1D field representation with given near-field components as the sum of the spatial field ansatz functions $P_i$ $$v(x) = \sum_{i=0}^{M-1} v_i P_i(x),$$

their derivatives can be calculated as $$\text{grad}[v(x)] = \sum_{i=0}^{M-1} v_i \text{grad}[P_i(x)] = \sum_{i=0}^{M-1} w_i P_i(x),$$

where the coefficients $w_i$ can be calculated recursively with $w_i = f(v_j, w_j)$. In particular, it is possible in accordance with the above embodiment for all i=M-1 up to 0 and $\hat{v}_M = 0$, $\hat{v}_{M-1} = v_{M-1}$, to determine $w_i$ with the recursion formula $w_i = (2i+1)\hat{v}_{i+1}$ and $$\hat{v}_{i-1} := v_{i-1} + \frac{l}{2i+1} w_i$$

for i>0. Thanks to a linear recursive formulation of this type, new coefficients $w_i$, for example of a subsequent time step or subsequent iteration, can be determined from previously determined coefficients $v_i$ and $w_i$.

In particular it is possible with this recursion to determine the derivative coefficients $w_i$ in a timestepping method from previously calculated coefficients $w_j$, $v_j$ and by means of the recursion formula from higher-indexed or lower-indexed components, e.g. $v_{i+1}$, $v_{i-1}$, $w_{i+1}$, $w_{i-1}$. This 1D representation can be transferred to the representation of 2D and 3D field components. In 2D or 3D cases, the field description is achieved by a tensor formulation where every tensor entry can be an aforementioned polynomial.

In accordance with an advantageous embodiment when the method in accordance with the invention is used in a time domain computation, it is possible, for determination of the electromagnetic near-field components, to apply an explicit time integration method, in particular a leapfrog or a Runge-Kutta timestepping method, or an implicit time integration method, where a termination criterion for the time integration can be a reach of a predeterminable number of time steps and/or a reach of a predeterminable energy field value or of another predeterminable termination criterion, in particular achievement of a predeterminable energy field value. This termination criterion can be a global field quantity such as the total energy of the field or a value of a Poynting vector, a local quantity such as the magnitude of a field value or values at selected points, and can be based on achievement of an absolute value or of a relative value development, for example the change in field or energy values over a lengthy period of observation.

An explicit integration method permits a simple direct calculation of the field values of a subsequent time step by values of one or more preceding time steps. An implicit method requires for this the solution of an equation system and hence involves a greater determination effort, since a direct update of the field values is not possible. A leapfrog method is a simple method for explicit numerical time integration of an ordinary differential equation by means of physical components offset by half a time step, for example electrical and magnetic field components allocated within a time grid and offset by half a time step. It is thus for example possible to calculate an electrical field strength component $E_x^{n+1}$ at the time $(n+1)\Delta t$ with time step $\Delta t$ from a previous electrical field strength component $E_x^n$ to the previous time step n and from the spatial derivative of a magnetic $H_z$ field strength component to the time step n+½ with $$E_x^{(n+1)} = E_x^{(n)} + \frac{d}{dx} H_z^{(n+1/2)}.$$

Runge-Kutta methods are based on a truncated Taylor series of a time derivative, where E-field and H-field components can be allocated on the same time grid. By using the leapfrog or Runge-Kutta timestepping method, a transient analysis of an electromagnetic field development can be efficiently performed with linear complexity of the computational effort for the spatial and/or time derivatives in N and M, where the computational effort for the entire problem can grow in superlinear manner up to a fixed end time T thanks to a stability criterion with regard to the time step.

In accordance with a further aspect of the invention, a device for application of a method according to one of the aforementioned method claims is proposed in order to determine an electromagnetic near-field of a field excitation source of an electrical system, in particular for analysis and/or optimization of an antenna radiation, of a cross-talk problem, of a signal reflexion/transmission, of a stray field, of an irradiation problem or similar. To that end, the device comprises a partitioning device for definition of an N-part partition of a calculation domain containing the system and inside which the near-field is to be determined; a material distribution unit for definition of electrical and magnetic properties of the material distribution of the system in each partition inside the domain under consideration; a source unit for definition of at least one field excitation source inside the system; a field determination unit for determining each electromagnetic near-field component inside at least one and in particular all partitions by solving the Maxwell's equations and taking into account the determined material distribution and the determined field excitation source. The field determination unit comprises a component determination means for ascertaining a linear position of predetermined ansatz functions $P_i$ orthogonal to one another with regard to the L2 scalar product and weighted with field coefficients $v_i$ for each near-field component, and a derivative determination means for determination of the spatial and/or time derivatives of each near-field component as a linear position of these ansatz functions $P_i$ weighted with derivative coefficients $w_i$ said derivatives being required for solution of the Maxwell's equations, where the derivative determination means is constructed for determining, during determination of the electrical near-field, every coefficient $w_i$ from a quantity of previously determined field coefficients $v_j$ and derivative coefficients $w_j$. As a result, the determination effort for the near-field of the system rises in substantially linear manner to the number N of partitions of the domain under consideration and to the number M of ansatz functions $P_i$ used in the linear position.

In other words, the device comprises a partitioning unit for partitioning a domain under consideration into N partitions, i.e. N grid cells, in particular a grid generator and a material distribution means for distribution of the electrical and magnetic properties of the material distribution of the system in every partition, so that the partitioning unit and the material distribution unit can represent or discretize a system in an N-partitioned domain under consideration. A source unit is used for definition of at least one excitation source for an electromagnetic field, for example a plane wave, a dipole radiation, an impressed current, a port excitation of a waveguide or similar. A field determination unit is constructed for determining in the partitions of the grid the electromagnetic near-field components by solving the Maxwell's equations, where the material distribution and the defined field excitation sources are taken into account. The field determination unit can be rated for a frequency or time domain determination of the electromagnetic fields, and uses a linear position of orthogonal ansatz functions $P_i$ weighted with field coefficients $v_i$ for ascertaining the electromagnetic near-field components, where the derivatives can be represented in the spatial and/or time respect as a further linear position of the ansatz functions with derivative coefficients $w_i$. The derivative coefficients $w_i$ can be calculated from a quantity of previously determined field coefficients $v_j$, $w_j$, for example of a preceding time step, or by recursively determined coefficients. The field determination unit can comprise for this purpose a rotation means (or curl means) for determination of the rotation of the fields in the interior of the grid cells, and a trace means for determining the boundary fields of each grid cell.

The device in accordance with the invention is thus used for performance of an above method and comprises units used for performing the corresponding process steps. The device is rated such that the determination complexity, i.e. the computational effort and the required memory for determination of the spatial and/or time derivatives of the near-field components, rises in substantially linear manner with the number N of partitions and the number M of ansatz functions, so that to increase the computation accuracy or to enlarge the computation area or the representation of complex systems regardless of the number M of ansatz functions (p-refinement), an extra effort linear in the number N of partitions (h-refinement) must be made (and vice versa).

In accordance with a further embodiment of the device, the partitioning unit is constructed to generate an unstructured N-part grid, in particular a tetrahedral grid, a prismatic grid a pyramidal grid or a mixed grid also with hexahedral cells for N-part partitioning of the domain under consideration, and a boundary condition unit is constructed to define electrical, magnetic or open boundary conditions of the domain under consideration. The partitioning unit, which can also be referred to as a grid generator, is constructed to create a structured grid, an unstructured grid or a mixed grid from these two. Partitioning units like this are known from the prior art and are used for generating a hexahedral, tetrahedral, pyramidal, prismatic grid or a mixed grid, including one with hexahedral cells, which is able to simulate material structures of electromagnetic systems with the lowest possible volume and surface defects. Furthermore, the device advantageously comprises a boundary condition unit constructed to define electrical and magnetic boundary conditions of the domain under consideration. Boundary conditions like this can for example be open boundary conditions simulating a continuous propagation of an electromagnetic wave or of an electromagnetic field outside the area of the domain under consideration, or also perfectly electrically conducting or magnetically conducting boundary conditions where electrical and/or magnetic fields are accordingly orthogonal to the boundaries of the domain under consideration. The boundary condition unit is used to set boundary conditions for solving the electromagnetic field problem, so that within the computation area realistic settings are defined for determining the electromagnetic field components.

In accordance with an advantageous further development of the device, the field determination unit is constructed to determine at least one and in particular all electromagnetic near-field components by means of a DG-FEM method (Discontinuous Galerkin Finite Element Method). A DG-FEM method for calculation of electromagnetic fields using orthogonal ansatz functions, whose weighting coefficients can be determined in linearly recursive manner from predetermined weighting coefficients, allows an efficient determination of electromagnetic fields with substantially linear complexity of the number N of partitions and, regardless of this, substantially linear complexity with regard to the number M of used ansatz functions $P_i$.

In accordance with a further advantageous embodiment, the field determination unit comprises a time integration means constructed to perform time integration of the near-field components of at least one and in particular all partitions preferably by means of a leapfrog or Runge-Kutta timestepping method. Alternatively, the field determination unit can comprise a frequency determination means constructed to perform a calculation in the frequency domain under consideration of a single or a few individual frequencies in order to conduct harmonic excitation analyses of an electromagnetic field component.

In accordance with a further advantageous embodiment of the device, the component determination means and the derivative determination means are constructed to determine the coefficients $w_i$ in linearly recursive manner from a quantity of previously determined coefficients $v_j$, $w_j$. Thus the component/derivative determination means advantageously comprise one or more data memories for storage of previously computed or previously determined field and derivative coefficients $v_j$, $w_j$, and furthermore comprise recursion means permitting linear recursive computation of coefficients from predetermined coefficients.

In accordance with a further advantageous embodiment, the component determination means and the derivative determination means are constructed to ascertain the ansatz function $P_i$ as orthogonal polynomials, in particular as Legendre polynomials and/or Jacobi polynomials. To do so, the above means can comprise a polynomial generating section suitable for determining, in particular recursively, orthogonal polynomials of any order and hence generating ansatz functions of any required accuracy.

In a further secondary aspect, the invention relates to a computer program product for determining an electromagnetic near-field of a field excitation source of an electrical system, where the computer program product comprises computer program instructions on a computer-readable program storage medium, in particular hard drive, CD-ROM, diskette, flash memory or similar, and the computer program instructions cause at least one computer to perform a method according to one of the above method claims when the instructions are read and carried out by the computer. This aspect of the invention thus relates to a computer-readable medium on which computer instructions are stored that when running on a computer can execute a method for determining an electromagnetic near-field of an electrical system, in order to analyse and/or optimize the system. The invention thus relates not only to a method and to a device, but also to a concrete computer storage medium and to computer-implemented instruction specifications for performing analysis and optimization of an electromagnetic field problem inside an electrical system, in order to analyse this system and to optimize it, by variation of mechanical or electromagnetic properties of the system with regard to a selected target quantity, for example a required radiation property, a low reflexion and high transmission property, reduction of an RCS value or similar.

Preferred Embodiments

The following presents a detailed exemplar embodiment of the method based on a fast application of operators in a discontinuous Galerkin formulation for the Maxwell's equations for calculating electromagnetic components. Some specific details of the following general description of the method will appear in a planned scientific article "Computer Algebra meets Finite Elements: an Efficient Implementation for Maxwell's Equations" by Christoph Koutschan, Christoph Lehrenfeld and Joachim Schoberl. The scientific paper will be published in the SFB/DK volume "Numerical and Symbolic Scientific Computing: Progress and Prospects", edited by U. Langer, P. Paule, Springer-Verlag, Wien, Austria 2011 and is expected to appear end of May 2011.

General Description of the Method

The method described in the following permits the fast determination simulation of antennas, filters, electromagnetic couplers, waveguides and circuits, and of scattering problems by spatial discretization of Maxwell's equations on three-dimensional unstructured grids consisting of tetrahedrons, prisms, pyramids and hexahedrons. For a temporal discretization, standard methods such as leapfrog, Runge-Kutta or other timestepping methods can be used. For a frequency domain analysis a temporal discretization is not required. Spatial discretization is based on a formulation as a discontinuous Galerkin method. The core of the implementation is formed by methods for storage-optimized and fast application of the operators involved (gradient, trace and their transposes and the mass operators and their inverses).

Description of the Formulation Used

During spatial discretization of the Maxwell's equations, discontinuous Galerkin formulations are used, for example the discontinuous Galerkin formulation with central fluxes from [3], shown in the following considering also electrical and magnetic losses:

$D^k, k \in [1, K_3]$ indicates the elements of the grid (e.g. tetrahedrons). The discontinuous ansatz and test spaces of the order p are indicated by $\vec{V}_k^p(D^k)$. What is required are $\vec{E}_h, \vec{H}_h \in \oplus_k \vec{V}_h^p(D^k)$, so that for all $\phi_h \in \oplus_k \vec{V}_h^p(D^k)$ for all elements $D^k$ the following applies:

$$\frac{d}{dt}(\varepsilon_r \vec{E}_h, \varphi_h)_{D^k} = -(\kappa_e \vec{E}_h, \varphi_h)_{D^k} + (\widetilde{\mathrm{curl}}_N \vec{H}_h, \varphi_h)^Z_{D^k}, \quad (1)$$

$$\frac{d}{dt}(\mu_r \vec{H}_h, \varphi_h)_{D^k} = -(\kappa_m \vec{H}_h, \varphi_h)_{D^k} + (\widetilde{\mathrm{curl}}_D \vec{E}_h, \varphi_h)^Y_{D^k}, \quad (2)$$

The following abbreviations are used here (valid for perfectly electrically conducting boundary conditions):

$$(\widetilde{\mathrm{curl}}_N \vec{H}_h, \varphi_h)^Z_{D^k} = (\mathrm{curl} \vec{H}_h, \varphi_h)_{D^k} - \frac{1}{2}\sum_{k=1}^{K}\left(\frac{Z^+}{Z}\vec{n} \times \lfloor \vec{H}_h \rfloor, \varphi_h\right)_{\partial D^k \backslash \partial \Omega} \quad (3)$$

$$(\widetilde{\mathrm{curl}}_D \vec{E}_h, \varphi_h)^Y_{D^k} = (\mathrm{curl} \vec{E}_h, \varphi_h)_{D^k} - \quad (4)$$

$$\frac{1}{2}\sum_{k=1}^{K}\left[\left(\frac{Y^+}{Y}\vec{n} \times \lfloor \vec{E}_h \rfloor, \varphi_h\right)_{\partial D^k \backslash \partial \Omega} - (\vec{n} \times \lfloor \vec{E}_h \rfloor, \varphi_h)_{\partial D^k \backslash \partial \Omega}\right]$$

It is possible to use anisotropic, variable and field-dependent (e.g. non-linear) materials, and the formulation can also be expanded for dispersive materials, various excitations and more complex boundary conditions. The formulation has the following special features:

With a suitably selected temporal integration scheme an explicit and conditionally stable method is obtained (e.g. with a symplectic Euler time integrator).

The method does not have any artificial damping, i.e. the formulation is energy-preserving for loss-free Maxwell's equations.

The formulation can be expanded such that it has no artificial eigenvalues (spurious modes).

In the discontinuous Galerkin formulation, it is essential to evaluate/apply, among others, terms of the following type:

$$(\kappa_e \vec{E}_h, \phi_h)_{D^k} \text{ (mass operator in 3D)} \tag{5}$$

$$(\text{curl } \vec{H}_h, \phi_h)_{D^k} \text{ (curl operator in 3D)} \tag{6}$$

$$(\vec{n} \times \vec{H}_h, \phi_h)_{\partial D^k} \text{ (trace operator 3D->3D)} \tag{7}$$

The storage-optimized and runtime-optimized fast application of these operators is described in the following.

Fast Application of Operators

The method achieves, thanks to an implicit and fast application of the operators involved (gradient, trace and their transposes, and the mass operators and their inverses) enhanced efficiency with regard to storage requirements and computation time on hexahedral, prismatic, pyramidal and tetrahedral elements. This represents the central component of the method. For each grid element, only auxiliary quantities are stored and the operators do not have to be explicitly set up as matrices. This permits complexity reduction of the storage requirement. By the use of hierarchical orthogonal ansatz functions (Legendre or Jacobi polynomials) with tensor structure (e.g. Dubiner ansatz on the tetrahedrons [2]) and covariant transformation to reference elements, the complexity of the runtime for the method is reduced. In the three-dimensional case, storage requirement and runtime of the algorithm possess the complexity $O(p^3)$ for non-curved elements with cell-constant and field-independent material coefficients and $O(p^4)$ for curved elements and/or variable and/or field-dependent material coefficients (i.e. non-linear material laws). p designates the polynomial degree of the method. Absolute runtimes and storage requirement are set forth in the calculation examples further below. For non-curved elements, the result is thus a linear complexity; for the curved elements applied only in special cases in part-areas, the result is a considerably less than quadratic complexity.

Further features of the method are:

Tetrahedral, pyramidal, prismatic and hexahedral elements with any polynomial degree are available to the method. Conforming grids with mixed element types can be used; when prismatic elements are used, however, grids with compatible numbering are essential;

Ansatz function spaces of different polynomial degrees can be used in individual elements of a grid;

Curved elements are available;

Cell-constant, variable and field-dependent material coefficients can be used and the material coefficients can have tensor form.

Fast Application of Mass Operators

In this method, mass operators (as indicated in equation (7)) and their inverses, for example the transformation of a field strength vector into a flux density vector (and vice versa), must be applied. By the use of transformations on a predefined reference element, the mass operators are dependent on the geometry of the individual elements. For plane elements, i.e. elements with constant Jacobi matrix of the transformation, with cell-constant and linear material coefficients, the result on account of the orthogonality of the ansatz functions is however 3×3 block-diagonal matrices with a complexity of the storage requirement and of the application of the operators and their inverses of $O(p^3)$ for equation (7).

For general elements (curved elements or elements with variable and/or field-dependent material coefficients), the result from exploiting the tensor structure of the ansatz functions in a so-called sum factorization [4, p. 179ff] is a fast application with the complexity of $O(p^4)$ or $O(p^3)$ in the runtime for the three-dimensional or two-dimensional case. For a fast application of the inverses with variable and/or field-dependent material coefficients, the operator can be suitably approximated from equation (7) in order to obtain a corresponding complexity.

The variable transformation coefficients for curved elements can be equivalently approximated, whereby a complexity of $O(p^4)$ or $O(p^3)$ results for the application and the storage requirement of the inverses for the 3-dimensional or 2-dimensional case.

Fast Application of Curl and Trace Operators and their Transposes

Thanks to the curl and trace operators, the spatial derivatives of the Maxwell's equations are obtained in the discontinuous Galerkin method. The curl operators act on the field quantities inside the grid cells and the trace operators provide the field quantities on the boundaries of the grid cells for establishing numerical fluxes between the grid cells.

The geometrical independence of the curl and trace operators is achieved by use of a covariant transformation of the ansatz and test functions of any elements from the function spaces of the reference elements, as described for example in [1 p. 331ff]. The following describes the core of the method, fast application of the curl and trace operators and their transposes for the grid elements. Recursion formulas for hierarchical orthogonal Jacobi polynomials were developed and used, which reduce the complexity of the storage requirement and of the application of the curl and trace operators and their transposes to $O(p^3)$.

Curl Operator

The application of the curl operator in equation (6) can be split into two part-problems: firstly the rotation (curl) of the three-dimensional ansatz or test functions is computed. Secondly the appropriate three-dimensional integration is performed against test or ansatz functions, and is a trivial scaling due to the orthogonality of the functions on the reference element, and due to the covariant transformation for curved elements too. The principle of recursion formulas for the application of the curl operator is explained in the following based on the one-dimensional gradient for Legendre polynomials $P_i(x)$: the task consists of determining with a given function v(x) as a linear combination of Legendre polynomials $$v(x) = \sum_{i=0}^{M-1} v_i P_i(x), \tag{8}$$

their derivative as a linear combination of Legendre polynomials $$\text{grad}[v(x)] = \sum_{i=0}^{M-1} v_i \text{grad}[P_i(x)] = \sum_{i=0}^{M-1} w_i P_i(x), \tag{9}$$

i.e. the coefficients $w_i$. By the following relationship of the Legendre polynomials $$\text{grad}[P_{i+1}] = \text{grad}[P_{i-1}] + (2i+1) P_i \tag{10}$$

the result is $$\text{grad}[v(x)] = \sum_{i=0}^{M-1} v_i \text{grad}[P_i'(x)] = \sum_{i=0}^{M-2} v_i \text{grad}[P_i(x)] + \quad (11)$$
$$v_{M-1}\text{grad}[P_{M-1}(x)]$$
$$= \sum_{i=0}^{M-2} v_i \text{grad}[P_i(x)] + v_{M-1}\text{grad}[P_{M-3}(x)] +$$
$$v_{M-1}(2M-3)P_{M-2}(x)$$
$$= \sum_{i=0}^{M-2} \tilde{v}_i \text{grad}[P_i(x)] + v_{M-1}(2M-3)P_{M-2}(x)$$

With this the coefficient $w_{n-1}$ was calculated:

$$w_{M-2} = v_{n-1}(2M-3). \quad (12)$$

By the further application of this principle, all coefficients $w_i$ of the gradient can be determined recursively, represented in the following in pseudo-code:

for i=M−2 down to 0

$$w_i = (2i+1)v_{i+1} \quad (13)$$

if (i>0) then $v_{i-1} := v_{i-1} + v_{i+1}$

The complexity of this application is O(P), i.e. it possesses a linear complexity in p and hence also in the number of unknowns per grid cell.

Legendre polynomials like Jacobi polynomials too form on the interval [−1, 1] an L2-integratable orthogonal function system, where the scalar product is defined as the integral of two of these functions, for Jacobi polynomials weighted with appropriate weighting functions, over the interval [−1,1]. A scalar product with regard to other ansatz functions that can depend on the selection of the basic grid system is defined in the same way.

In the three-dimensional case, appropriate recursive application rules can be devised for hexahedrons, prisms, pyramids and tetrahedrons with suitably selected ansatz functions based on hierarchical Jacobi polynomials. The result here due to the higher spatial dimension is a complexity of the application of $O(p^3)$. The transpose of this operator can be calculated equivalently.

For deriving these recursion formulas, methods for determination of multivariant holonomic functions in algorithmic manner can be used, as already suggested by D. Zeilberger [7] and developed according to [6]. A principal property of holonomic functions is that they can be defined by means of linear recurrences or differential equations and the appropriate starting values. The class of holonomic functions is closed with regard to addition, multiplication and certain substitutions. The ansatz functions used in this invention can be incorporated without problem into the class of holonomic functions. A first step when dealing with holonomic functions is to calculate from the given function expression, e.g.

$$f(i,j,x,y) = P_j^{(2i+1,0)}\left(\frac{2y}{1-x} - 1\right),$$

the linear recurrences and differential equations, for which f is sufficient, where mixed difference differential equations are also permissible (the algorithms for calculation of the holonomic closure properties were introduced by F. Chyzak [5] in his dissertation). All these relations form a left ideal in an operator algebra; these are certain inclined polynomial rings (Ore algebras). The problem is now to find an element of a certain form in this left ideal. In the present case, a derivative of the basic function $f$, e.g. the derivative according to the variable x, is to be expressed by the function $f$, where the indices i, j and k may be shifted. In the required relation, therefore, only the first derivative after x can occur, no higher x-derivatives and no derivatives after y or z. Further, the coefficients should be free of x, y and z. Once a Gröbner ansatz of the left ideal has been calculated, it is possible by means of an approach to calculate the required relation.

Trace Operator

The application of the trace operator from equation (7) can also be split up into two subproblems: firstly the boundary values of the three-dimensional ansatz and test functions are represented by the two-dimensional ansatz and test functions, and vice versa. Secondly, the appropriate two-dimensional scaling is applied which due to the covariant transformation is also trivial for curved elements. The calculation of the boundary values corresponds to the following problem:

Given is a function v(x) on an element $D^k$ (e.g. tetrahedron) by the linear combination of the ansatz functions $\phi_i(x) \in \vec{V}_h^P(D^k)$:

$$v(x) = \sum_{i=0}^{M_E-1} v_i \varphi_i(x) \quad \forall x \in D^k. \quad (14)$$

Required is now a representation of the trace (i.e. the boundary values) of the function v(x) as a linear combination of the ansatz functions $\psi_i(x) \in \vec{W}_h^P(F^k)$ on a boundary element $F^k$ (e.g. triangle):

$$tr_{F^k} v(x) = \sum_{i=0}^{M_R-1} w_i \psi_i(x) \quad \forall x \in F^k. \quad (15)$$

This can in turn be calculated for the selected ansatz functions based on hierarchical Jacobi polynomials by a recursion formula with the complexity $O(p^3)$. The transpose of this operator can be calculated equivalently. For developing this recursion formula, it is in turn possible as described above to use methods for determining multivariant holonomic functions in algorithmic manner.

Calculation Examples

The method described above was implemented in C++. The following lists the computation times per unknown of the method for a 64-bit system with an Intel Xeon CPU 5160 3.00 GHz, depending on the polynomial order p for a tetrahedron grid with 2078 elements in a randomly selected unit of time dimension normalized to the order p=1:

TABLE 1

Computation time for uncurved tetrahedron elements. Theoretical dependence is O(1).

| Order p | Computation time [any unit] |
|---|---|
| 1 | 1.0 |
| 2 | 1.0 |
| 3 | 1.2 |
| 4 | 1.3 |
| 5 | 1.9 |
| 6 | 2.1 |

TABLE 1-continued

Computation time for uncurved tetrahedron elements. Theoretical dependence is O(1).

| Order p | Computation time [any unit] |
|---|---|
| 7 | 2.2 |
| 8 | 2.6 |
| 9 | 2.8 |
| 10 | 2.9 |

TABLE 2

Computation time for curved tetrahedron elements. Theoretical dependence is O(p).

| Order p | Computation time [μsec] |
|---|---|
| 1 | 1.0 |
| 2 | 0.51 |
| 3 | 0.39 |
| 4 | 0.37 |
| 5 | 0.41 |
| 6 | 0.44 |
| 7 | 0.48 |
| 8 | 0.55 |
| 9 | 0.59 |
| 10 | 0.62 |

The divergences from the theoretical effort complexity in p can be explained by runtime influencing of the algorithm due to different cache efficiencies and different additional costs due to function calls. These can be further optimized.

LITERATURE

[1] Gary C. Cohen: "Higher-Order Numerical Methods for Transient Wave Equations. Springer, 2002.
[2] Moshe Dubiner: "Spectral methods on triangles and other domains", Journal of Scientific Computing, 6:345-390, 1991.
[3] Jan S. Hesthaven and Tim Warburton: "Nodal Discontinuous Galerkin Methods—Algorithms, Analysis, and Applications", Springer Science+Business Media, LLC, New York, 2008.
[4] George Em Karniadakis and Spencer Sherwin: "Spectral/hp Element Methods for Computational Fluid Dynamics", Oxford Univ. Press, 2005.
[5] Frédéric Chyzak: "Fonctions holonomes en Calcul formel", PhD thesis, Ecole polytechnique, 1998.
[6] Christoph Koutschan: "Advanced Applications of the Holonomic system Approach", PhD thesis, RISC-Linz, Johannes Kepler Universität 2009.
[7] Doron Zeilberger: "A holonomic systems approach to special function identities", Journal of Computational and Applied Mathematics, 32(3):321-368, 1990.

DRAWINGS

Further advantages are found in the present description of the drawing. The drawing display embodiments of the invention. The drawing, the description and the claims contain numerous features in combination. The person skilled in the art will expediently consider the features individually too and combine them in a useful manner.

Figure 2:
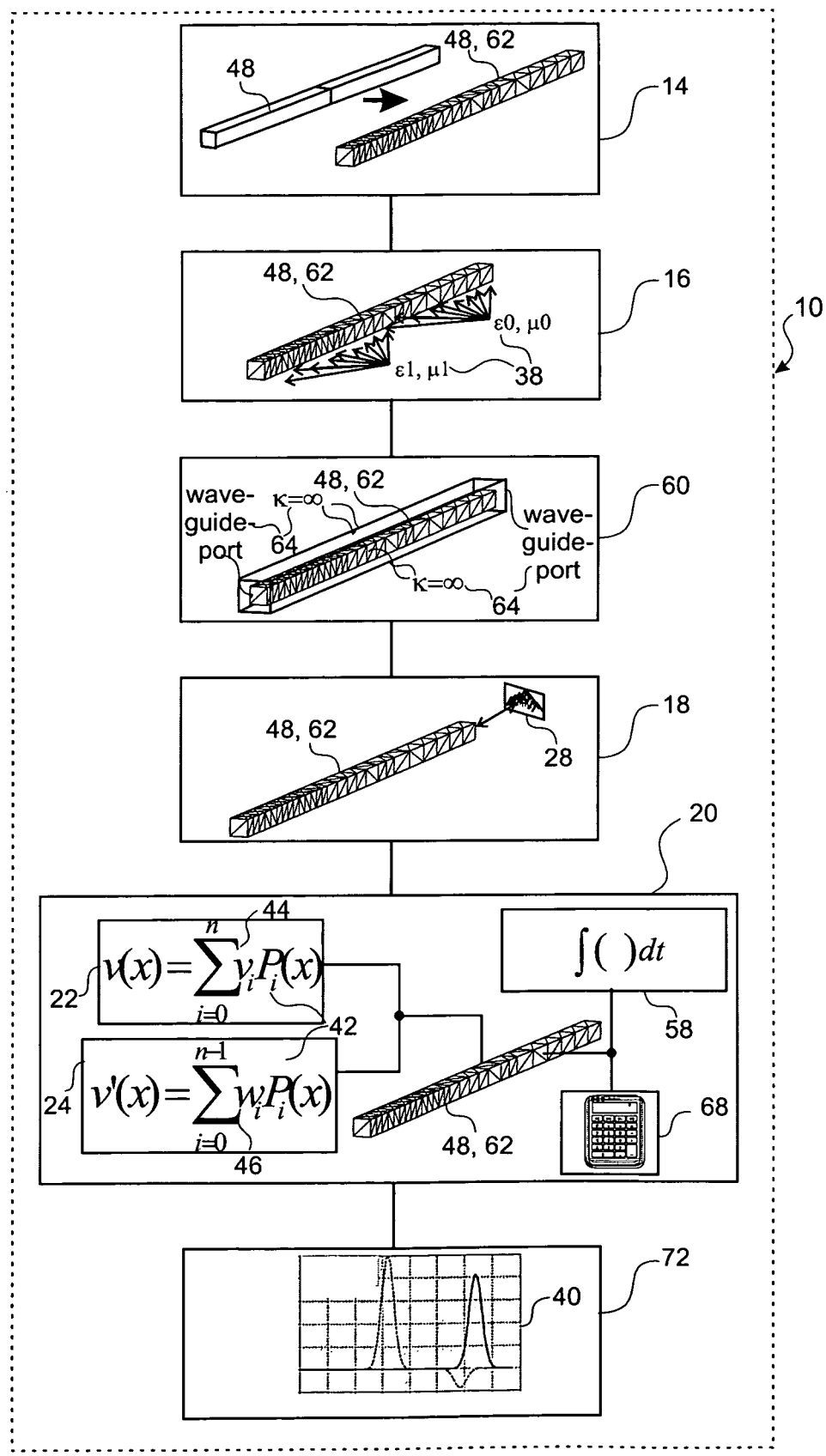
Figure 3:
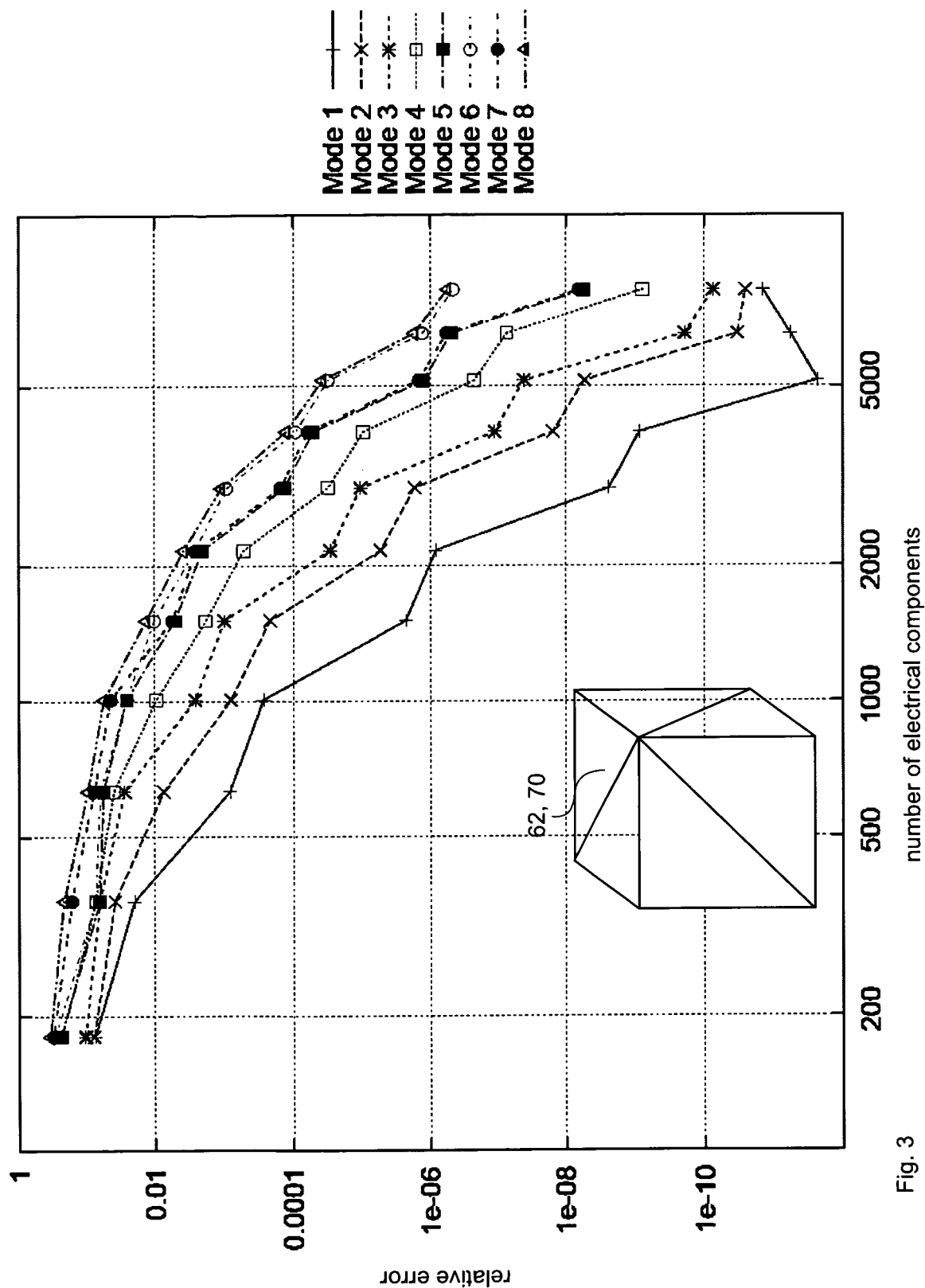
Figure 4:
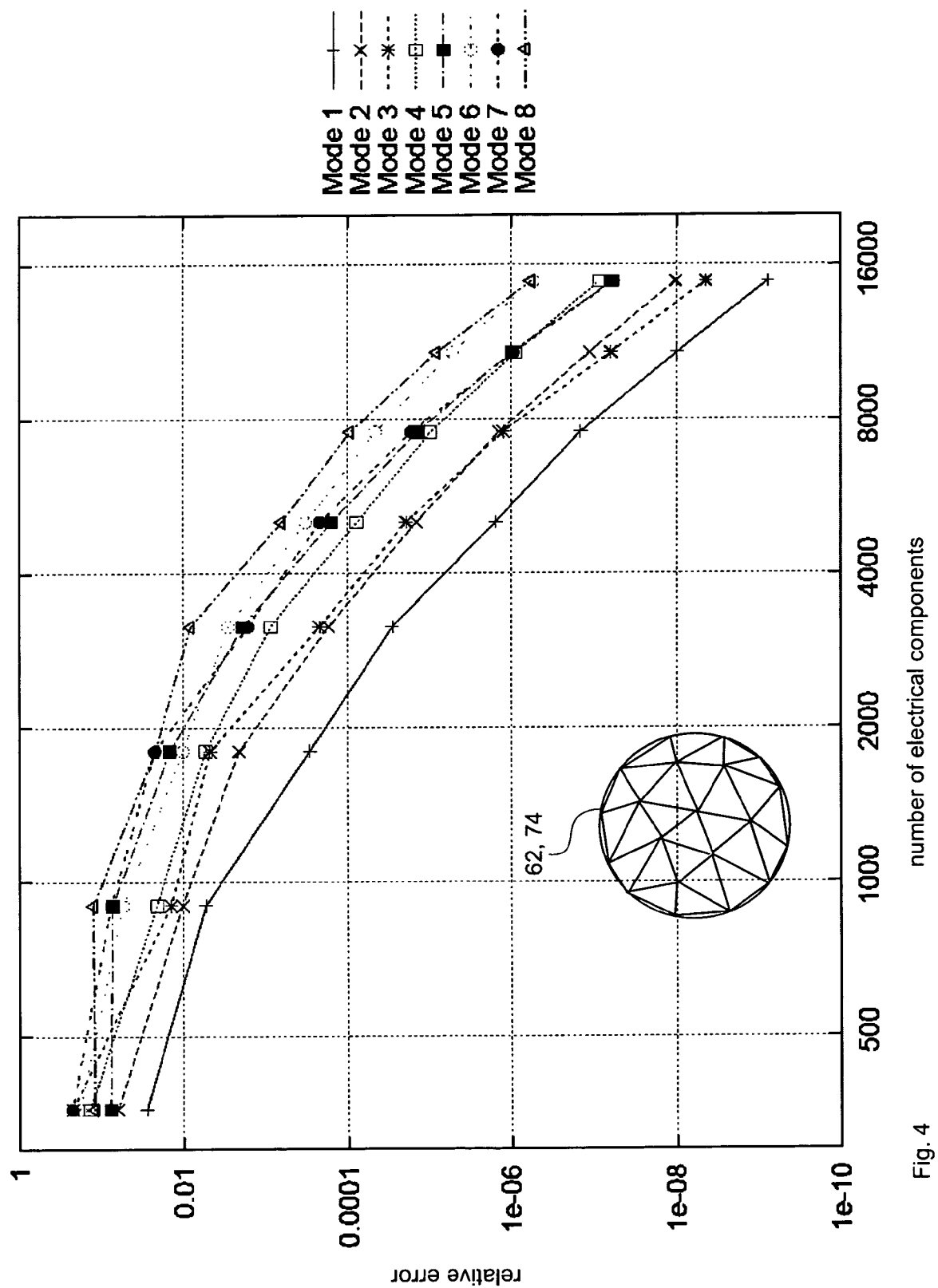
Figure 5A:
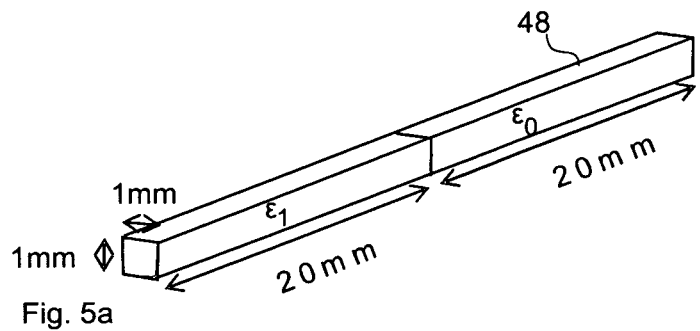
Figure 5B:
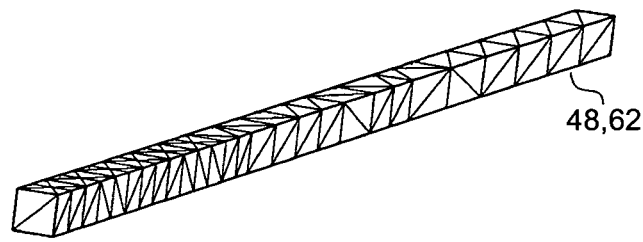
Figure 6:
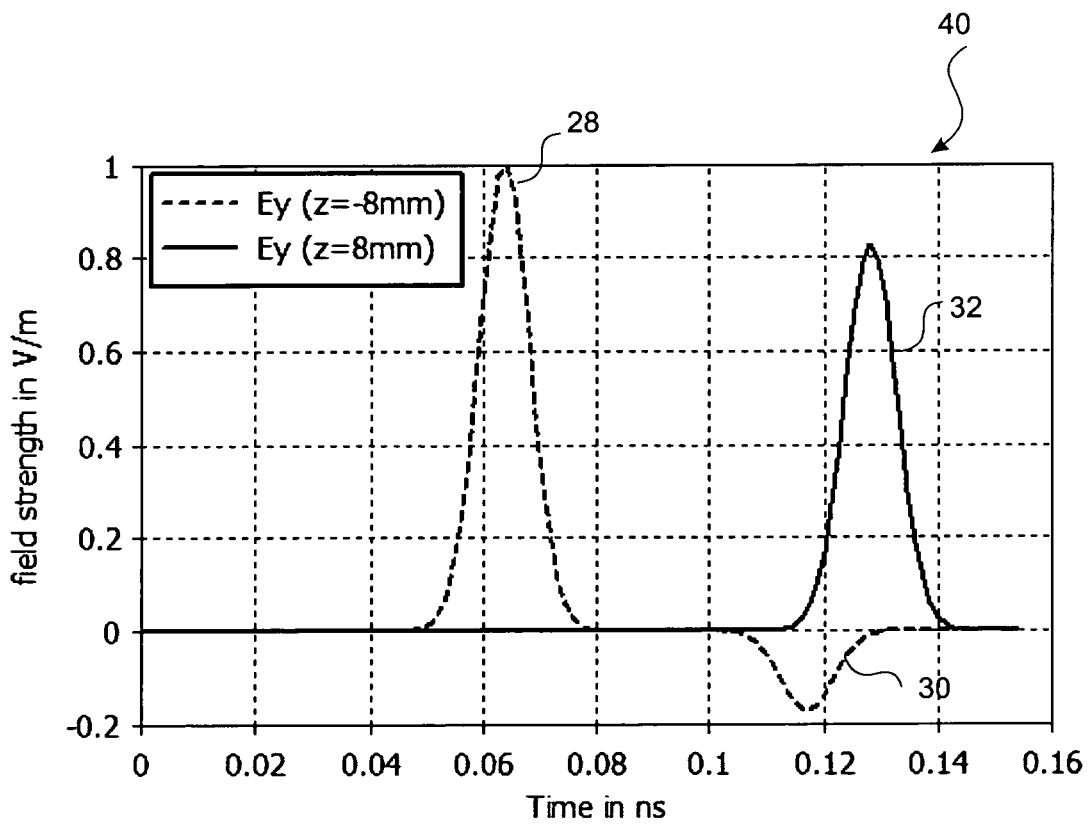
Figure 9:
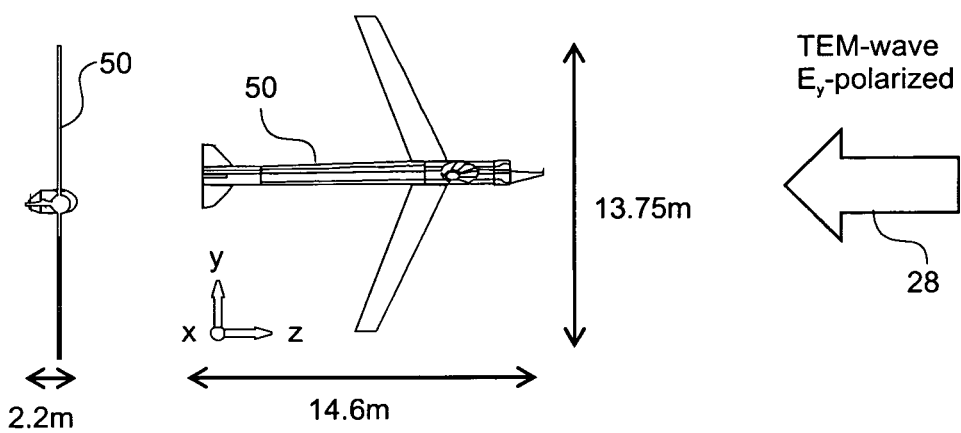
Figure 10:
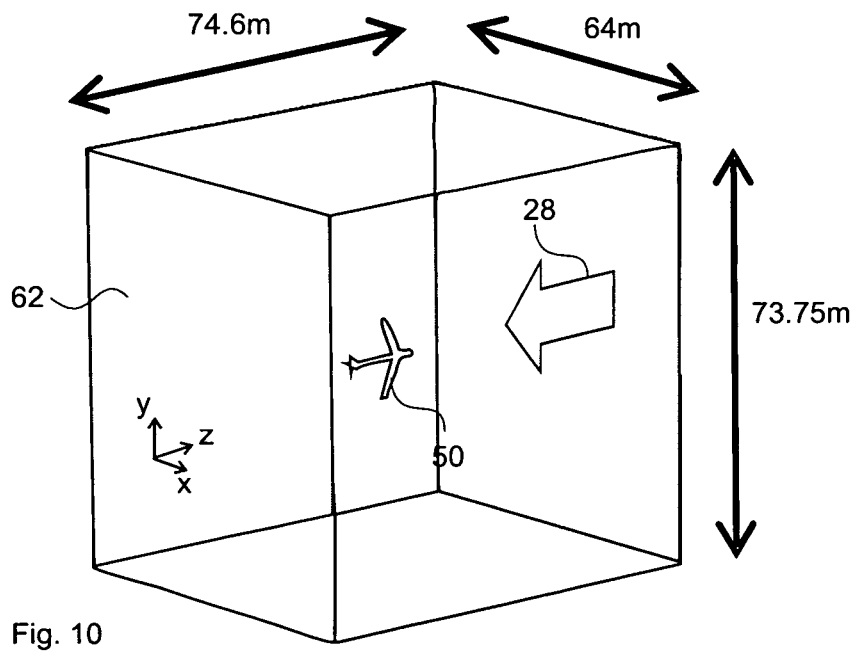
Figure 13:
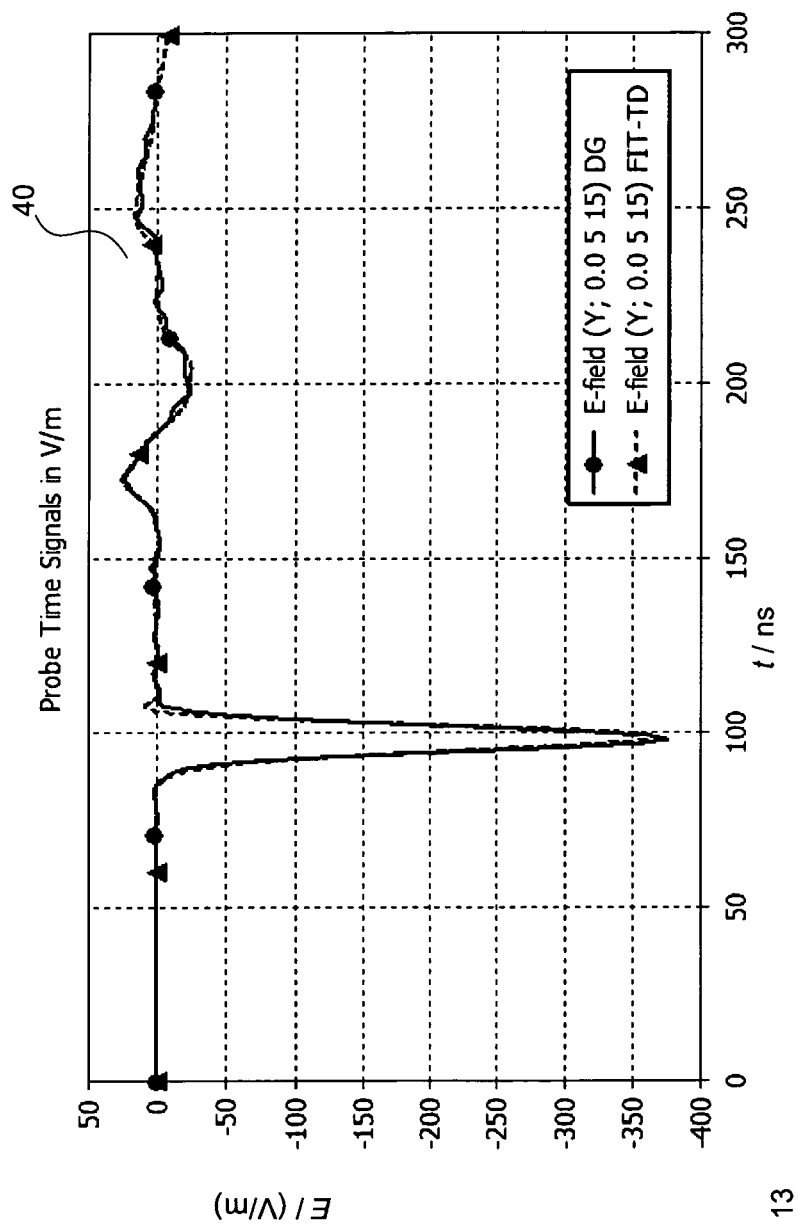

The drawing shows in:

FIG. 1 a schematic flow chart of a first embodiment of the method;

FIG. 2 a schematic block representation of a first embodiment of a device in accordance with the invention;

FIG. 3 error analyses during application of an embodiment of a method in accordance with the invention with Legendre polynomials up to degree 12 for resonance-analysis of a rectangular resonator;

FIG. 4 a convergence study of an eigenmode-analysis of a spherical resonator using an embodiment of the method in accordance with the invention with polynomials of polynomial degree 1 to 8;

FIG. 5 a rectangular wave guide of an electrical system with two different dielectric fillings and a tetrahedral discretization;

FIG. 6 a time domain result of a pulse reflexion of the waveguide shown in FIG. 5 using an embodiment of the method in accordance with the invention;

FIG. 7 a graph of magnitude and phase of a transmission parameter of an electrical mode propagating through the waveguide shown in FIG. 5 with application of a method in accordance with the invention;

FIG. 8 different partition cell types of an unstructured grid;

FIG. 9 a model of an electromagnetic system of an aircraft with incident plane wave;

FIG. 10 a domain under consideration of the electrical system shown in FIG. 9;

FIG. 11 a cross-section through a tetrahedral partition of the domain under consideration in FIG. 10;

FIG. 12 a result of a near-field analysis of an incident wave on the aircraft shown in FIG. 9 with application of an embodiment of the method in accordance with the invention;

FIG. 13 a time development of an electromagnetic field component with application of a time domain method of an embodiment.

Figure 14A:
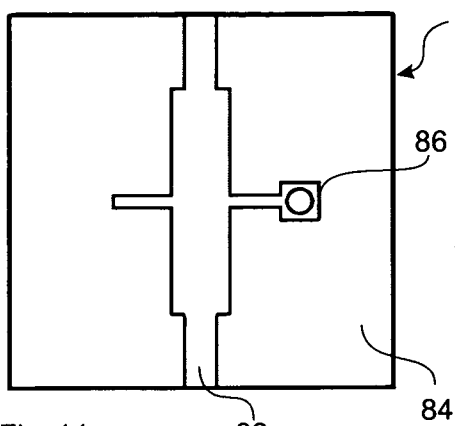
Figure 14B:
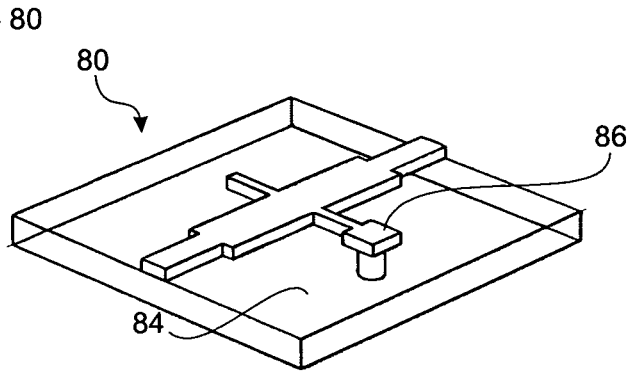
Figure 15:
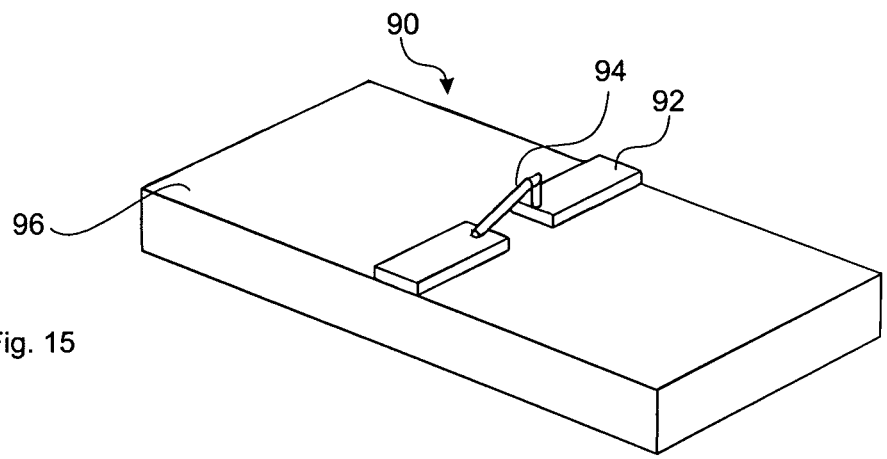
Figure 16:
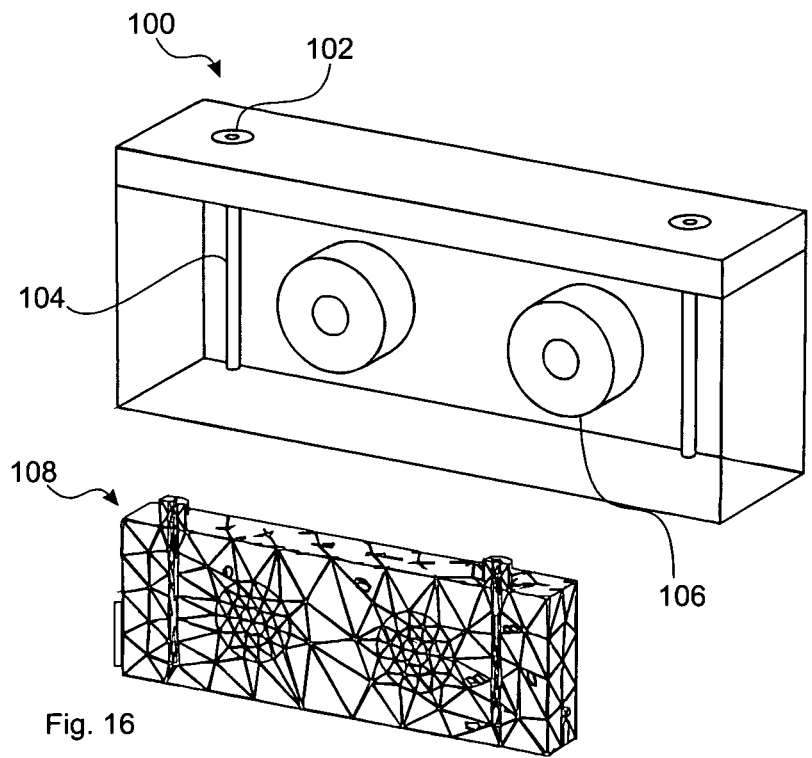

FIG. 14 a microstrip phase bridge of an electrical system analysed by an embodiment of the invention;

FIG. 15 a PCB bond wire connection of an electrical system analysed by an embodiment of the invention;

FIG. 16 a Langer filter structure analysed by an embodiment of the invention;

FIG. 17 an S-parameter analysis with increasing order p of the used test functions and calculation time per DoF for the microstrip phase bridge of FIG. 14. analysed by a time domain simulation according to an embodiment of the invention.

EMBODIMENTS OF THE INVENTION

In the figures, identical or similar components are identified with the same reference numbers.

FIG. 1 represents a flow chart of an embodiment of the method in accordance with the invention. In step S1 the electrical system is defined in a domain under consideration split into N-partitions, where material distributions are assigned to the individual partitions (grid cells), in particular $\epsilon$ and $\mu$ distributions (electrical permittivity and magnetic permeability) and suitable boundary conditions for a proper definition of the field behaviour at the boundaries of the domain under consideration are stipulated (open boundaries, perfectly electrically conducting boundaries, perfectly magnetically conducting boundaries, mixed forms etc.).

In step S2, excitation sources for excitation of an electromagnetic field are defined, for example these can be dipole excitations, current-carrying conductors, port excitations, i.e. imprinting of coupled field modes, TEM waves or other electromagnetic excitation sources.

In step S3, the domain under consideration is partitioned by tetrahedral, hexahedral, polyhedral, pyramidal or prismatic cells in order to create the N-part partition.

In step S4, boundary values and field components are initialized, for example for preparation of a timestepping method, whereupon an explicit time step formulation by means of a leapfrog or Runge-Kutta method can be applied.

In step S5, the individual field components are determined by means of a time step update with a suitable time step which as a rule is oriented to a stability criterion, where in step S6 a termination criterion is checked, for example the fading of a field energy below a predeterminable value, expiry of a certain time or of a certain number of time steps or similar. As long as the termination criterion is not met, the time step update according to step S5 is further performed. After ending of the time step loop, in step S7 the recorded time fields are post-processed, transformed by means of an FFT/DFT, for example in the frequency domain, and derived quantities, for example transmission and reflexion parameters, are calculated and visualisations of the fields are prepared.

By means of the described method and with the use of orthogonal ansatz functions whose time and/or spatial derivatives are also obtained from the linear positions of these ansatz functions, a computation method of linear complexity can be proposed whose time-related and storage-related effort grows in substantially linear manner with the number of partitions N used and with the number M of ansatz functions $P_i$ per field component.

FIG. 2 represents in a block diagram an embodiment 10 of a device for determining the near-field of an electrical system, where the field calculation unit 10 comprises a partitioning unit 14 for partitioning of an electrical system into individual grid cells, a material distribution unit 16 for assignment of a material distribution to the individual grid cells, a boundary condition unit 60 for definition of boundary conditions, a source unit 18 for definition of a field excitation source and a field determination unit 20 for determination of an electrical field, and a post-processing unit 72 for post-processing of derived quantities 40 from the results of the field calculation. The partitioning unit 14 provides a transformation of a waveguide 48 comprising two different dielectric materials $\epsilon_1$, $\epsilon_2$ into a domain under consideration 62, and discretizes the waveguide 48 by tetrahedral grid cells 52. In the downstream-connected material distribution unit 16, the individual tetrahedral grid cells are assigned electrical and magnetic permeability and permittivity values $\mu$, $\epsilon$ and in the boundary condition unit 60 the longitudinally extending boundaries of the waveguides 48 are defined as perfectly electrically conducting boundaries, and the boundaries closing in the longitudinal direction are defined as so-called "waveguide ports" for coupling and decoupling of waveguide modes. The boundary conditions 64 define the behaviour of the electromagnetic fields at the boundary of the domain under consideration and establish in the subsequent computation step the influence of boundaries for the determination of the field propagation. The source unit 18 defines an electromagnetic field excitation source 28 which in this case is provided by an inprint of a waveguide mode at a longitudinal boundary of the waveguide 48 of the discretizing model 62. The field determination unit 20 comprises a component determination means 22 for generating a linear position with regard to the L2-scalar product of orthogonal predetermined ansatz functions $P_i$ 42 which weighted with field coefficients v, 44 characterize the field developing of each field component. Furthermore, the field determination unit 20 comprises a derivative determination means 24 which can determine the derivative of the linear position describing the field from orthogonal ansatz functions which in turn results as the linear position of this ansatz function $P_i$ 42 weighted with derivative coefficients $w_i$ 46. The ascertainment of the field coefficients $v_i$ 44 and derivative coefficients $w_i$ 46 can be linearly recursive, for example by a determination control means 68.

Furthermore, the field determination unit 20 comprises a time integration means 58 performing a leapfrog scheme or a Runge-Kutta time step scheme for temporal integration of the Maxwell's equations for transient analysis of the near-field development of the domain under consideration. After completion of the temporal integration, for example after fading of the electromagnetic field within the domain under consideration, the recorded fields or coupled and decoupled fields from the computation area are analyzed by means of a post-processing unit 72, where for example reflexion and transmission coefficients S11, S12, S22, S21 of a waveguide transition can be determined.

FIG. 3 shows a calculation example of eigenmodes of a rectangular resonator 70 by means of an embodiment of the method in accordance with the invention. The rectangular resonator 70 was discretized with six tetrahedral elements and the first eight resonance frequencies of the eigenmodes of the rectangular resonator 70 were determined, whereby the polynomial degree of the ansatz polynomials was increased from 2 to 12, thereby resulting in an accuracy increase of the field calculation results. The relative error in the resonance frequencies compared with an analytical solution is shown for the first eight modes as a function of the selected polynomial degree 2 to 12, where the relative error converges exponentially.

FIG. 4 records in analogous manner a calculation example for determination of the first eight eigenmodes of a spherical resonator 74 discretized by means of thirty curved tetrahedral elements. The relative error compared with the analytical self-resonances of the first eight modes is shown with an increase of the polynomial degree of $1 \leq p \leq 8$, where the error converges exponentially.

FIG. 5 shows a waveguide 48 through which a plane TEM wave can be guided. The waveguide 48 has dimensions of a cross-section of one millimeter and a 40 mm length, where it is in some sections filled with dielectric materials having different permittivities $\epsilon_0$, $\epsilon_1$. The waveguide 48 is closed at its two ends with perfectly electrically conductive materials, while the longitudinal limiting surfaces are closed with perfectly magnetically conducting boundary conditions. FIG. 5b displays the discretization of the waveguide 48 by means of 327 tetrahedral cells in the domain under consideration 62, where the field values are described with polynomials up to the fourth degree. During discretization, the area with a higher $\epsilon_1$ is more finely discretized than the area with the lower $\epsilon_0$, corresponding to the ratio of the permittivity values. For simulation, a TEM wave with a Gaussian pulse with the center frequency of 37.5 GHz is excited at a longitudinal end of the waveguide 48.

FIG. 6 shows the temporal development of the field excitation 28 in a dashed line as a pulse at around 0.06 ns. With a time lag, a dashed line indicates the reflected pulse at the transition layer of the two dielectricity materials at around 0.12 ns as a signal reflexion 30 and shortly after that on the opposite side the exiting pulse form of the signal transmission 32. The time curves show the signal values of two electromagnetic near-field components 40 of electrical field strength $E_y$ at positions z=−8 mm and z=8 mm.

Figure 7B:
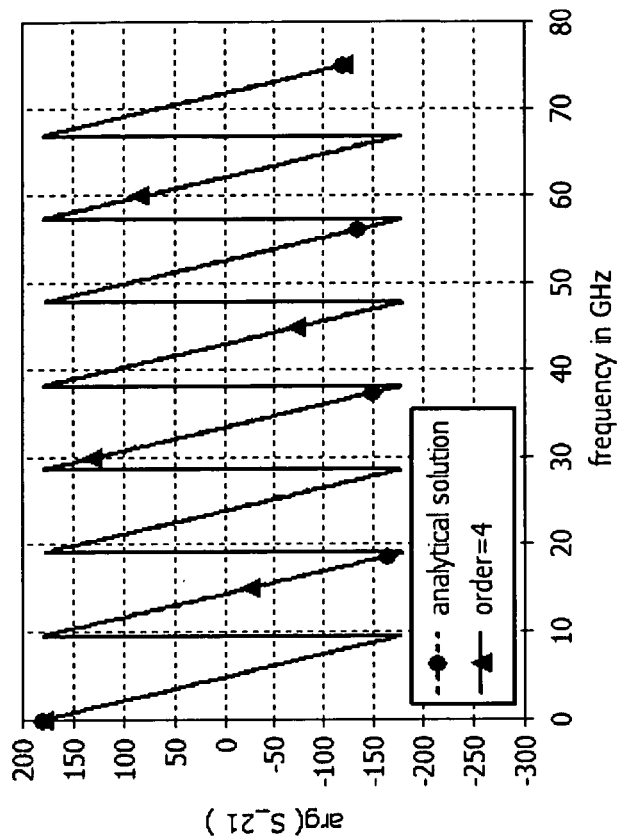
Figure 7A:
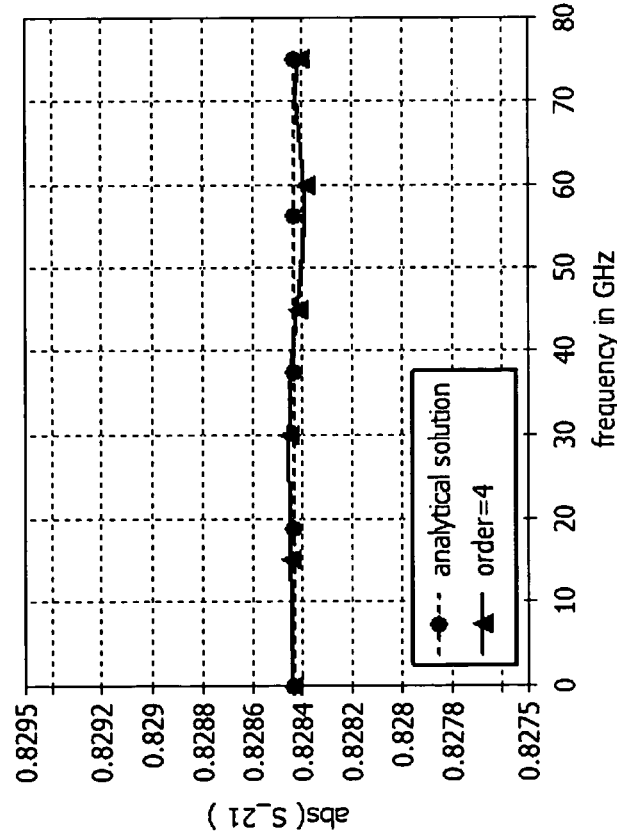

From the temporal development of the electrical near-field components of FIG. 6 and with the help of FFT/DFT operations a broad-band study can be performed in frequency domain for calculation of the transmission value S21 in the frequency domain. FIG. 7a shows the amount |S21| of the signal transmission 32 in broad band, and FIG. 7b the graph of the phase angle of S21 when ansatz functions up to the fourth order are used, with use of an embodiment of the method in accordance with the invention.

The grid of FIG. 5b was discretized with 327 tetrahedral cells and the ansatz functions have a maximum order of four. In FIGS. 7a and 7b the simulated near-field components were compared with analytical results, with no significant divergences being discernible.

Figure 8A:
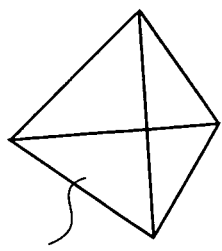
Figure 8B:
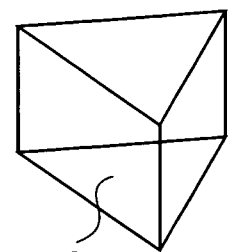

FIG. 8 shows basic forms of different grid cells (partitions), as can be advantageously used in embodiments of the method in accordance with the invention. FIG. 8a shows the prototype of a tetrahedral grid cell 52 having four surfaces, six edges and four nodes. FIG. 8b shows a prismatic grid cell 56 having five surfaces, nine edges and six nodes. On the surfaces and in the volume of the grid cells, ansatz functions can be defined for a description of the electromagnetic components in the grid cell and along its faces, edges and vertices.

FIG. 9 displays a discretized model of an aircraft 50 onto which is exposed to an incident plane TEM wave, as can be emitted for example by a radar apparatus. An analysis of the stray field of the aircraft 50 permits conclusions to be drawn about the RCS (Radar Cross Section) of the aircraft, which provides a measure for the reflected radar image and is for example important in the military field for the development of aircraft shapes with a significantly reduced radar visibility. FIG. 9 indicates the dimensions of the aircraft, where FIG. 10 represents a calculation domain 62 inside which the aircraft 50 is considered, where an $E_y$-polarized TEM source as the field excitation source 28 vertically impacts on the aircraft. In this connection, FIGS. 11a and 11b show two-dimensional cross-sections through the domain under consideration 62 discretzed by a tetrahedral grid, where FIG. 11a shows a cross-sections through an air-filled area of the domain under consideration 62, and FIG. 11b shows a cross-sections through the aircraft where the unstructured tetrahedral grid provides a high resolution of the aircraft details 50 inside the computation area 62. The aircraft has a wingspan of 13.75 meters and a length of 14.6 meters. Its height is 2.2 meters. The computation area is quadratically split in a dimension of 64 m×73.75 m×74.6 m (W×H×D), where a symmetry property is exploited for reduction of the computational effort. FIG. 12 displays an isoplot representation of absolute values for electrical field strengths of the electromagnetic near-field components 40 in the computation area at a time 208 ns after emission of the plane TEM wave 28, where a stray field 34 exists around the aircraft 50 from which the RCS can be calculated. The plane wave as the field excitation source 28 can be clearly discerned.

FIG. 13 shows a temporal development graph of a point monitor of a near-field component 40 at point (0.0,5,15) in comparison with a high-resolution FI time domain calculation which supplies almost identical results. Hence an implementation of the method in accordance with the invention can be compared with a result of a proven time domain calculation using a structured hexahedron-based grid. For resolution of the domain under consideration 62, 18,894 tetrahedrons were used, where the polynomial degree of the used polynomials is up to 6.

Figure 17A:
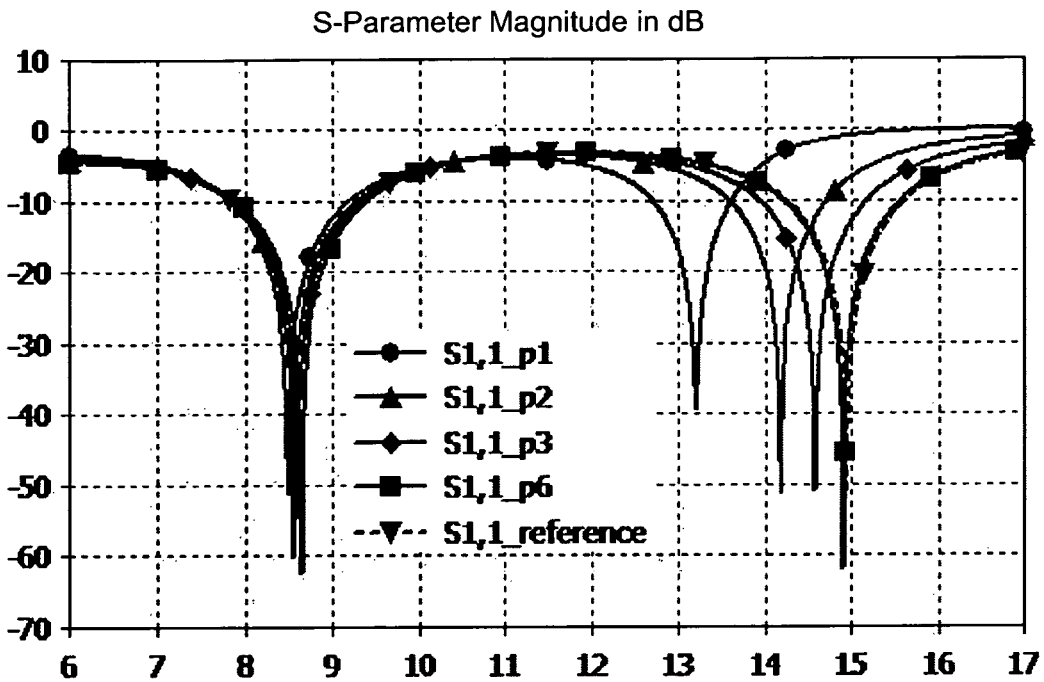
Figure 17B:
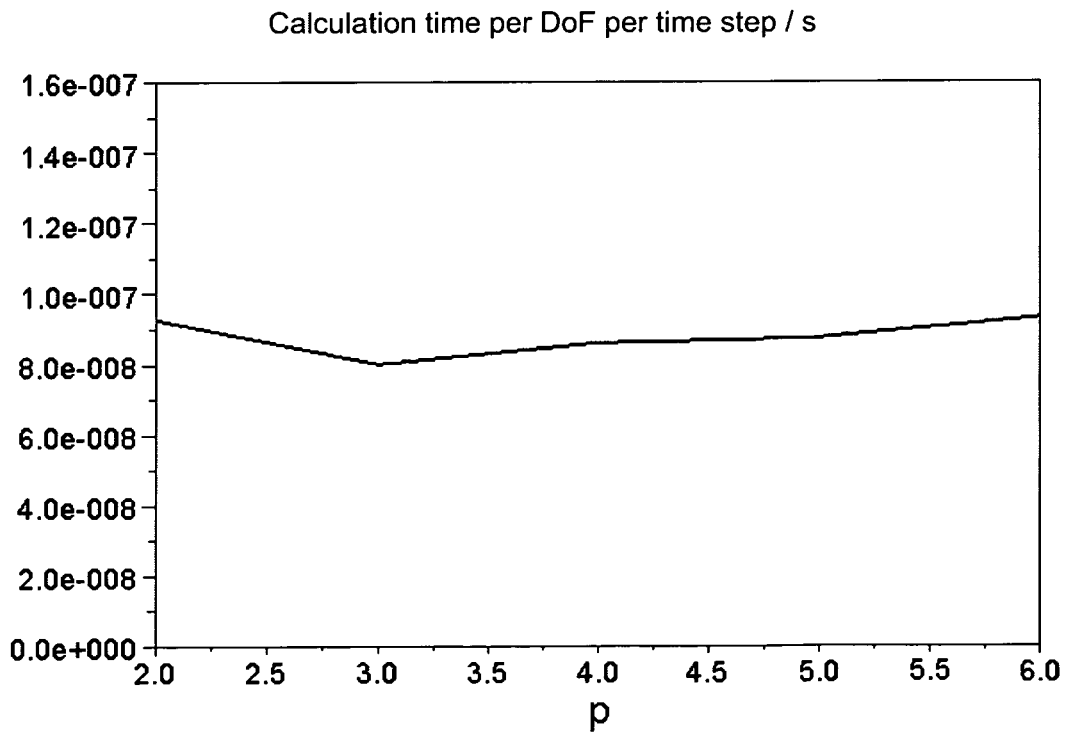

FIG. 14 displays a microstrip phase bridge 80 of an electrical system analysed by an embodiment of the invention. The two port symmetric microstrip phase bridge 80 comprises a substrate 84 with a rel. permittivity of 9.9 and a metallization layer 82 consisting of a PEC material (perfectly electric conducting) like copper or aluminium with a 10 mil thickness. The mechanical dimensions of the phase bridge 80 is adapted for providing the RF-characteristics. The structure is discretized by 783 tetrahedral mesh cells. FIG. 17a displays a p-refinement study in time domain using test functions with an order of p=1, p=2, p=3 and p=6 against a TET-FD reference solution (FEM-frequency domain solution). The S11 parameters (reflection coefficient) of the numerical results converge with increasing order p. With p=3 and p=6 no significant difference against the reference solution can be noticed. FIG. 17b displays the numerical effort as calculation time per DoF (degree of freedom of the field solution) per timestep, i.e. the numerical effort for determining each field component at each timestep. It can be noticed that while the order p of the test function increases, the numerical effort for determining of each field value still remains the same. While increasing the element order p, due the increasing number of basis functions (order of 3) and temporal refinement for the explicit time stepping (order of 2).

FIG. 15 shows a PCB bond wire connection 90 of an electrical system analysed by an embodiment of the invention. The metallization layer 92 has a thickness of 5 mil and the substrate 96 a rel. permittivity of 9.9. The bond-wire 94 connects two metallization pads 92 being located on the substrate 96 and provides a frequency dependent reflection of RF-signals. An S-parameter analysis in time domain using test functions with an order p=1 (linear functions) shows an excellent agreement with a FEM-FD simulation.

FIG. 16 displays a two port Langer filter structure 100 analysed by an embodiment of the invention. The Langer filter 100 comprises two coaxial-coupling ports 102, each port feeds a coupling antenna 104. The Langer filter 100 is enclosed in a rectangular shaped PEC box cavity with an inner dimension of 66 mm×26.9 mm×16 mm and comprises two dielectric rings 106 influencing the filter characteristic together with the mechanical dimension and the configuration of the coupling antennas 104. In the lower left corner of FIG. 16 the tetrahedral grid comprising 2481 cells (1073 curved cells) as starting point of a simulation is displayed. Due to the structural symmetry only half of the Langer filter 100 need to be discretized and is analyzed in time domain up to a maximal frequency range of about 6.5 GHz with test functions of order p=3. The derived S-parameters show an excellent agreement with a reference solution using results from a FEM-FD simulation.

The method provides ideally a linear complexity of the computational effort with regard to the number of partitions N and to the number of ansatz functions M when structured grids are used, in particular tetrahedral or prismatic grids, where curved and finely detailed areas of an electrical system can be extremely highly resolved. If curved grid cells are used, the effort is increased. Hence the proposed method enables the application of an FEM formulation for structured and unstructured grids with increased surface and volume approximation accuracy with a substantially linear scalability of the determination effort with regard to N and M.

10 Field calculation device
12 Electrical system
14 Partitioning unit
16 Material distribution unit
18 Source unit
20 Field determination unit
22 Component determination means
24 Derivative determination means
26 Electromagnetic near-field
28 Field excitation source
30 Signal reflexion
32 Signal transmission
34 Stray field 36 Partition, grid cell
38 Material distribution
40 Electromagnetic near-field component
42 Ansatz function
44 Field coefficient
46 Derivative coefficient
48 Waveguide
50 Aircraft
52 Tetrahedral grid cell
56 Prismatic grid cell
58 Time integration means
60 Boundary condition unit
62 Domain under consideration, computation area, calculation domain
64 Boundary condition
66 Computation grid
68 Determination control means
70 Rectangular resonator
72 Post-processing unit
74 Spherical resonator
80 Microstrip phase bridge
82 PEC-Metallization
84 Substrate
86 Metallized via
90 PCB bond wire
92 PEC-metallization
94 Bond-Wire
96 PCB substrate
100 Langer Filter
102 Coaxial port
104 Coupling antenna
106 Dielectric ring
108 Tetrahedal grid

The invention claimed is:

1. A computer implemented method for optimizing an electromagnetic near-field of a field excitation source of an electrical system within a three-dimensional (3D) domain under consideration comprising a 3D computer model of the system split into N partitions, the partitions being described by a tetrahedral or mixed grid containing at least one tetrahedral cell, comprising:
   defining, using a computer, electrical and magnetic properties of the material distribution of the system in each partition within the domain under consideration;
   defining, using the computer, at least one field excitation source within the system;
   determining, using the computer, the electromagnetic near-field components within all partitions by solving Maxwell's equations of the near-field, taking into account the defined material distribution and the defined field excitation source,
   updating parameters of the system, based on the determination of the electromagnetic near-field components, with respect to an antenna radiation behaviour, a beam direction optimization, a suppression of cross-talk, an optimization of a transmission or reflexion of electromagnetic waves or a minimization of a stray field of said electrical system, whereby individual component parameters including at least one of material properties, mechanical dimensions and/or excitation frequencies of said electrical system are varied within the framework of the optimization process,
   where each near-field component of each partition is represented by a linear position of M predetermined ansatz functions $P_i$ orthogonal to one another with regard to a scalar product and weighted with field coefficients $v_i$, and the spatial and/or time derivative of the near-field component resulting from an application of inverse 3D mass, 3D curl and 3D trace operators required for solution of the Maxwell's equations is determined as a linear position of these ansatz functions $P_i$ weighted with derivative coefficients $w_i$, and where when ascertaining the electrical near-field each coefficient $w_i$ is determined from a quantity of field coefficients $v_i$ and previously determined derivative coefficients $w_j$, so that the detennination effort of the spatial and/or time derivative rises in substantially linear manner to the number of partitions in the domain under consideration and to the number M of ansatz functions $P_i$ used in the linear position.

2. Method according to claim 1, where each electromagnetic near-field component is ascertained by means of a DG-FEM (Discontinous Galerkin Finite Element Method).

3. Method according to claim 1, where each coefficient $w_i$ can be linearly recursively calculated from a set of previously determined components $v_j$, $w_j$, in particular each spatial ansatz function $P_i$ of each partition can be represented as $$v(x) = \sum_{i=0}^{M-1} v_i P_i(x)$$

and the spatial derivative of the near-field component of each partition can be calculated as $$\mathrm{grad}[v(x)] = \sum_{i=0}^{M-1} v_i \mathrm{grad}[P_i(x)] = \sum_{i=0}^{M-1} w_i P_i(x),$$

where each coefficient $w_i$ can be calculated recursively with $w_i = f(v_j, w_j)$.

4. Method according to claim 3, where the ansatz functions $P_i$ are orthogonal polynomials, in particular Legendre polynomials and/or Jacobi polynomials.

5. Method according to claim 4, where for a 1D field representation with Legendre polynomials for i=M−1 to 0 and $\hat{v}_M = 0$, $\hat{v}_{M-1} = v_{M-1}$ the following applies recursively:

$$w_i = (2i+1)\hat{v}_{i+1} \text{ and } \hat{v}_{i-1} := v_{i-1} + \frac{1}{2i+1} w_i \text{ for all } i > 0.$$

6. Method according to claim 1, where for determination of the electromagnetic near-field components an explicit and/or implicit time integration method, in particular a leapfrog or a Runge-Kutta timestepping method, is applied, where a termination criterion for the time integration is the achievement of a predeterminable number of time steps and/or the achievement of a predeterminable energy field value or of another predeterminable termination criterion, in particular achievement of a predeterminable energy field value.

7. A computer system configured to optimize an electromagnetic near-field of a field excitation source of an electrical system within a three-dimensional (3D) domain under consideration comprising a 3D computer model of the system split into N partitions, the partitions being described by a tetrahedral or mixed grid containing at least one tetrahedral cell, the computer system being configured to:
   define and store, via a partitioning unit, an N-part partition of a calculation domain containing the electrical system and inside which the near-field is to be determined, the partitioning unit being configured to generate an unstructured N-part tetrahedral, prismatic, or mixed spatial grid;

define and store, via a material distribution unit, electrical and magnetic properties as electrical permittivity, magnetic permeability, and electrical conductivity of the material distribution of the system in each partition inside the domain under consideration;

define and store, via a source unit, at least one field excitation source inside the system;

determine and store, via a field determination unit, each electromagnetic near-field component inside all partitions by solving the Maxwell's equations and taking into account the defined and stored material distribution and the defined and stored field excitation source, update parameters of the system, based on the electromagnetic near-field components determined and stored via the field determination unit, with respect to an antenna radiation behavior, a beam direction optimization, a suppression of cross-talk, an optimization of a transmission or reflexion of electromagnetic waves or a minimization of a stray field of said electrical system, whereby individual component parameters including at least one of material properties, mechanical dimensions and/or excitation frequencies of said electrical system are varied within the framework of the optimization process, where the field determination unit is configured to ascertain a linear position of M predetermined ansatz functions $P_i$ orthogonal to one another with regard to a scalar product and weighted with field coefficients $v_i$ for each near-field component and to determine spatial and/or time derivatives of each near-field component resulting from an application of inverse 3D mass, 3D curl and 3D trace operators as a linear position of these ansatz functions $P_i$ weighted with derivative coefficients $w_i$ the derivatives being required for the solution of the Maxwell's equations, wherein the field determination unit is configured to determine, during determination of the spatial derivative of each electrical near-field component, every coefficient $w_i$ from a quantity of previously determined field coefficients v and derivative coefficients $w_j$, so that a determination effort of the near-field of the system rises in substantially linear manner to the number N of the partitions of the domain under consideration and to the number M of ansatz functions $P_i$ used in the linear position.

8. The computer system according to claim 7, where the field determination unit is configured to determine at least one electromagnetic near-field component by means of a DG-FEM method (Discontinuous Galerkin Finite Element Method).

9. The computer system according to claim 7, where the field determination unit is configured to perform time integration of the near-field components of at least one and in particular all partitions by means of a leapfrog or Runge-Kutta timestepping method.

10. The computer system according to claim 7, where the field determination unit is configured to determine each coefficient $w_i$ in a linearly recursive manner from a quantity of previously determined coefficients $v_j$, $w_j$.

11. The computer system according to claim 7, where the field determination unit is constructed to ascertain the ansatz functions $P_i$ as orthogonal polynomials.

12. A computer program product for determining an electromagnetic near-field, of a field excitation source of an electrical system, where the computer program product comprises computer program instructions on a non-transitory computer-readable program storage medium, and the computer program instructions are configured to cause at least one computer to perform a method according to claim 1 when the instructions are read and carried out by the computer.

* * * * *